US008383483B2

(12) United States Patent
Arnold et al.

(10) Patent No.: US 8,383,483 B2
(45) Date of Patent: Feb. 26, 2013

(54) HIGH PERFORMANCE CMOS CIRCUITS, AND METHODS FOR FABRICATING SAME

(75) Inventors: John C. Arnold, Ridgefield, CT (US); Glenn A. Biery, Staatsburg, NY (US); Alessandro C. Callegari, Yorktown Heights, NY (US); Tze-Chiang Chen, Yorktown Heights, NY (US); Michael P. Chudzik, Danbury, CT (US); Bruce B. Doris, Brewster, NY (US); Michael A. Gribelyuk, Stamford, CT (US); Young-Hee Kim, Yorktown Heights, NY (US); Barry P. Linder, Hastings-on-Hudson, NY (US); Vijay Narayanan, New York, NY (US); Joseph S. Newbury, Irvington, NY (US); Vamsi K. Paruchuri, New York, NY (US); Michelle L. Steen, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 354 days.

(21) Appl. No.: 12/541,562

(22) Filed: Aug. 14, 2009

(65) Prior Publication Data
US 2010/0041221 A1 Feb. 18, 2010

Related U.S. Application Data

(62) Division of application No. 11/323,578, filed on Dec. 30, 2005.

(51) Int. Cl.
*H01L 21/336* (2006.01)
(52) U.S. Cl. .......... 438/287; 438/199; 257/369
(58) Field of Classification Search .......... 257/369; 438/199, 287
See application file for complete search history.

(56) References Cited

U.S. PATENT DOCUMENTS

| 6,894,353 | B2 | 5/2005 | Samavedam et al. |
| 6,908,801 | B2* | 6/2005 | Saito .............. 438/199 |
| 7,023,055 | B2 | 4/2006 | Ieong et al. |
| 7,329,923 | B2 | 2/2008 | Doris et al. |
| 2003/0092238 | A1* | 5/2003 | Eriguchi .............. 438/287 |
| 2004/0023478 | A1 | 2/2004 | Samavedam et al. |
| 2004/0232499 | A1 | 11/2004 | Ryoo |

(Continued)

FOREIGN PATENT DOCUMENTS

CN 1520613 A 8/2004

OTHER PUBLICATIONS

U.S. Office Action dated Aug. 17, 2011, received in related U.S. Appl. No. 11/323,578.
Chinese Office Action dated Apr. 27, 2011 received in related case, namely CN 200610147073.
U.S. Office Action dated Feb. 22, 2011.

*Primary Examiner* — Wael Fahmy
*Assistant Examiner* — Tifney Skyles
(74) *Attorney, Agent, or Firm* — Scully, Scott, Murphy & Presser, P.C.; Louis J. Percello, Esq.

(57) ABSTRACT

The present invention relates to complementary metal-oxide-semiconductor (CMOS) circuits that each contains at least a first and a second gate stacks. The first gate stack is located over a first device region (e.g., an n-FET device region) in a semiconductor substrate and comprises at least, from bottom to top, a gate dielectric layer, a metallic gate conductor, and a silicon-containing gate conductor. The second gate stack is located over a second device region (e.g., a p-FET device region) in the semiconductor substrate and comprises at least, from bottom to top, a gate dielectric layer and a silicon-containing gate conductor. The first and second gate stacks can be formed over the semiconductor substrate in an integrated manner by various methods of the present invention.

15 Claims, 25 Drawing Sheets

U.S. PATENT DOCUMENTS

2005/0064690 A1  3/2005  Amos et al.
2005/0106788 A1  5/2005  Amos et al.
2005/0272235 A1  12/2005  Wu et al.
2006/0138475 A1* 6/2006  Lander et al. ................ 257/288

* cited by examiner

HIGH PERFORMANCE CMOS CIRCUITS, AND METHODS FOR FABRICATING SAME

RELATED APPLICATIONS

This application is a divisional application of U.S. Ser. No. 11/323,578, field Dec. 30, 2005.

FIELD OF THE INVENTION

The present invention generally relates to semiconductor devices, such as high performance complementary metal-oxide-semiconductor (CMOS) circuits, that each contains at least one n-channel field effect transistor (n-FET) and at least one p-channel field effect transistor (p-FET). More specifically, the present invention relates to CMOS circuits that each contains at least one n-FET gate stack having a gate dielectric layer and a metallic gate conductor, and at least one p-FET gate stack having a gate dielectric layer and a silicon-containing gate conductor, as well as to methods for forming such CMOS circuits.

BACKGROUND OF THE INVENTION

In standard CMOS technology, an n-FET device uses an As (or other donor) doped n-type polysilicon layer as a gate electrode, which is deposited on top of a semiconductor oxide or semiconductor oxynitride gate dielectric layer. The gate voltage is applied through this n-doped polysilicon layer to create an inversion channel in the p-type silicon underneath the gate dielectric layer. Similarly, a p-FET device uses a boron (or other donor) doped p-type polysilicon layer as a gate electrode, which is also deposited on top of a semiconductor oxide or semiconductor oxynitride gate dielectric layer. The gate voltage is applied through the p-doped polysilicon layer to create an inversion channel in the n-type silicon underneath the gate dielectric layer.

However, limitations of polysilicon gate electrodes are inhibiting further gains in the CMOS device performance. Future generations of device logic will be required to use replacement materials for the gate electrodes.

Specifically, metallic materials have been shown as promising gate electrode materials for achieving further gains in device performance.

However, integration of the metallic gate electrodes into the CMOS circuits has proven challenging. Specifically, for alternatives to the conventional gate structures (i.e., comprising p-doped and n-doped polysilicon gate electrodes) to be fully realized, the n-FET and p-FET devices of the CMOS circuits must comprise different metals, and complimentary metals with work functions that are equivalent to the p-doped and n-doped polysilicon gate electrodes must be integrated simultaneously to form the respective n-FET and p-FET gate structures in the CMOS circuits. Patterning, thermal budget restraints, and material interactions associated with front-end-of-line (FEOL) logic integration have been problematic for a number of candidate metal materials.

As the industry struggles to find metal solutions for the p-FET and n-FET gate structures, there is a need for CMOS circuits that contain heterogeneous n-FET and p-FET gate structures for achieving continuous gains in the CMOS device performance.

SUMMARY OF THE INVENTION

The present invention, in one aspect, relates to a semiconductor device comprising:

a semiconductor substrate containing at least first and second device regions adjacent to each other;

a first gate stack located over the first device region, wherein the first gate stack comprises at least, from bottom to top, a gate dielectric layer comprising a dielectric material having a dielectric constant (k) equal to or greater than that of silicon dioxide, a metallic gate conductor, and a silicon-containing gate conductor; and a second gate stack located over the second device region, wherein the second gate stack comprises at least, from bottom to top, a gate dielectric layer and a silicon-containing gate conductor.

The term "metallic" as used herein refers to a structure or component that is formed essentially of a conductive material containing at least one metal in an elemental form, an alloy form, or a compound form. Examples of such conductive material include, but are not limited to: elemental metals, metal alloys, metal nitrides, metal silicides, etc. Preferably, the metallic gate conductor of the first gate stack comprises a metal nitride or a metal silicon nitride that contains a Group IVB or VB metal. More preferably, the metallic gate conductor comprises TiN, TaN, a ternary alloy of Ti—La—N, a ternary alloy of Ta—La—N, or a stack with a ternary alloy of Ti—La—N and Ta—La—N.

Preferably, but not necessarily, the gate dielectric layer of the first gate stack comprises a hafnium-based dielectric material selected from the group consisting of hafnium oxide, hafnium silicate, hafnium silicon oxynitride, a mixture of hafnium oxide and zirconium oxide, and multilayers thereof.

The metallic gate conductor of the first gate stack preferably comprises a metal nitride or a metal silicon nitride that contains a Group IVB or VB metal. More preferably, the metallic gate conductor comprises TiN, TaN, a ternary alloy of Ti-RE-N (RE stands for rare earth metal), a ternary alloy of Ta-RE-N, a ternary alloy of Ti-AE-N (AE stands for alkaline earth metal), a ternary alloy of Ta-AE-N, or a stack containing mixtures thereof.

The silicon-containing gate conductors of the first and second gate stacks preferably comprise polycrystalline silicon.

The first and second gate stacks as described hereinabove constitute a basic heterogeneous gate configuration for the semiconductor device of the present invention. Such first and second gate stacks may comprise one or more additional layers for further improvements of the device performance or manufacturability in the present invention.

For example, the first gate stack may further comprise an interfacial layer located beneath the gate dielectric layer and an additional silicon-containing gate conductor located above the silicon-containing gate conductor, and the second gate stack may further comprise an additional silicon-containing gate conductor located above the silicon-containing gate conductor.

For another example, the first gate dielectric stack may further comprise a conductive oxygen barrier layer located above the metallic gate conductor and beneath the silicon-containing gate conductor.

For yet another example, the first gate dielectric stack may further comprise an interfacial layer located beneath the gate dielectric layer, and a rare earth metal-containing or an alkaline earth metal-containing layer located above, or within, the gate dielectric layer and underneath the metallic gate conductor. If the first gate dielectric stack comprises a rare earth metal-containing layer, the rare earth metal-containing layer preferably comprises an oxide or nitride of at least one rare earth metal. Alternatively, if the first gate dielectric stack comprises an alkaline earth metal-containing layer, the alkaline earth metal-containing layer preferably comprises a compound having the formula $M_xA_y$, wherein M is at least one alkaline earth metal, and wherein A is one of O, S, or a halide, x is 1 or 2, and y is 1, 2 or 3.

In another aspect, the present invention relates to a method for forming the semiconductor device with the basic heterogeneous gate configuration (i.e., without any additional layer), comprising:

forming a first gate dielectric layer and a silicon-containing gate conductor selectively over the second device region of the semiconductor substrate;

forming a protective capping layer selectively over the second device region;

forming a second gate dielectric layer and a metallic gate conductor selectively over the first device region of the semiconductor substrate, wherein the second gate dielectric layer comprises a dielectric material having a dielectric constant (k) greater than or equal to that of silicon dioxide;

removing the protective capping layer from the second device region;

depositing a silicon-containing layer over both the first and second device regions; and patterning the silicon-containing layer, the metallic gate conductor, the second gate dielectric layer, the silicon-containing gate conductor, and the first gate dielectric layer to form first and second gate stacks.

In yet another aspect, the present invention relates to a method for forming the semiconductor device with the basic heterogeneous gate configuration (i.e., without any additional layer), comprising:

forming a first gate dielectric layer, a metallic gate conductor and a silicon-containing gate conductor selectively over the first device region of the semiconductor substrate, wherein the first gate dielectric layer comprises a dielectric material having a dielectric constant (k) greater than or equal to that of silicon dioxide;

forming a second gate dielectric layer over both the first and second device regions;

depositing a silicon-containing layer over both the first and second device regions;

planarizing the silicon-containing layer, the second gate dielectric layer and the silicon-containing gate conductor to remove portions of the silicon-containing layer and the second gate dielectric layer from the first device region and to expose an upper surface of the silicon-containing gate conductor in the first device region, and wherein the exposed silicon-containing gate conductor in the first device region is substantially coplanar with the un-removed portion of the silicon-containing layer in the second device region; and patterning the exposed silicon-containing gate conductor, the metallic gate conductor, the first gate dielectric layer and the un-removed portions of the silicon-containing layer and the second gate dielectric layer to form first and second gate stacks.

In still another aspect, the present invention relates to a method for forming the semiconductor device with the basic heterogeneous gate configuration (i.e., without any additional layer), comprising:

forming a first gate dielectric layer, a metallic gate conductor and a silicon-containing gate conductor selectively over the first device region of the semiconductor substrate, wherein the first gate dielectric layer comprises a dielectric material having a dielectric constant (k) greater than or equal to that of silicon dioxide;

forming a second gate dielectric layer over both the first and second device regions;

depositing a silicon-containing layer over both the first and second device regions;

selectively etching the silicon-containing layer to remove a portion of the silicon-containing layer from the first device region;

selectively etching the second gate dielectric layer to remove a portion of the second gate dielectric layer from the first device region, thereby exposing an upper surface of the silicon-containing gate conductor; and patterning the exposed silicon-containing gate conductor, the metallic gate conductor, the first gate dielectric layer and un-removed portions of the silicon-containing layer and the second gate dielectric layer to form first and second gate stacks.

In a further aspect, the present invention relates to a method for forming a semiconductor device, while the first gate stack of such a semiconductor device further comprises an interfacial layer located beneath the gate dielectric layer and an additional silicon-containing gate conductor located above the silicon-containing gate conductor, and the second gate stack further comprises an additional silicon-containing gate conductor located above die silicon-containing gate conductor. This method specifically comprises the steps of:

forming a first gate dielectric layer and a silicon-containing gate conductor selectively over the second device region of the semiconductor substrate;

forming an interfacial layer, a second dielectric layer, a metallic layer, and a silicon-containing layer over both the first and second device regions;

selectively remove the interfacial layer, the second dielectric layer, the metallic layer, and the silicon-containing layer from the second device region, thereby exposing an upper surface of the silicon-containing gate conductor in the second device region;

forming an additional silicon-containing layer over both the first and second device regions; and patterning the additional silicon-containing layer, the silicon-containing layer, the metallic layer, the second dielectric layer, the interfacial layer, the silicon-containing gate conductor and the first gate dielectric layer to form first and second gate stacks.

In a still further aspect, the present invention relates to a method for forming a semiconductor device, while the first gate stack of such a semiconductor device further comprises a conductive oxygen barrier layer located above the metallic gate conductor and beneath the silicon-containing gate conductor. This method specifically comprises the steps of:

forming a first dielectric layer, a metallic gate conductor and a conductive oxygen diffusion barrier layer selectively over the first device region of the semiconductor substrate;

oxidizing an exposed upper surface of the semiconductor substrate in the second device region to form a second gate dielectric layer, wherein the conductive oxygen diffusion barrier layer protects the first device region from oxidation;

depositing a silicon-containing layer over both the first and second device regions; and patterning the silicon-containing layer, the conductive oxygen diffusion barrier layer, the metallic gate conductor, the first gate dielectric layer, and the second gate dielectric layer to form first and second gate stacks.

In yet another aspect, the present invention relates to a method for forming the semiconductor device with the basic heterogeneous gate configuration (i.e., without any additional layer), comprising:

forming a first dielectric layer, a metallic gate conductor and an insulating oxygen diffusion barrier layer selectively over the first device region of the semiconductor substrate;

oxidizing an exposed upper surface of the semiconductor substrate in the second device region to form a second gate dielectric layer, wherein the insulating oxygen diffusion barrier layer protects the first device region from oxidation;

removing the insulating oxygen diffusion barrier layer from the first device region to expose an upper surface of the metallic gate conductor;

depositing a silicon-containing layer over both the first and second device regions; and patterning the silicon-containing layer, the metallic gate conductor, the first gate dielectric layer, and the second gate dielectric layer to form first and second gate stacks.

In a still further aspect, the present invention relates to a method for forming a semiconductor device, while the first gate stack of such a semiconductor device comprises a hafnium-based high k (i.e., having a dielectric constant greater than that of the silicon dioxide) gate dielectric layer, and it further comprises an interfacial layer located beneath the high k gate dielectric layer, and a rare earth metal-containing or an alkaline earth metal-containing layer located above, or within, the high k gate dielectric layer and beneath the metallic gate conductor. This method specifically comprises the steps of:

forming an interfacial layer and a hafnium layer selectively over the first device region of the semiconductor substrate;

oxidizing the hafnium layer to form a high k gate dielectric layer that comprises hafnium oxide in the first device region, wherein an upper surface of the semiconductor substrate in the second device region is concurrently oxidized to form a gate dielectric layer in the second device region;

forming a rare earth metal-containing or an alkaline earth metal-containing layer selectively over the first device region;

depositing a metallic layer over both the first and second device regions;

selectively removes the metallic layer from the second device region, thereby exposing an upper surface of the gate dielectric layer in the second device region;

depositing a silicon-containing layer over both the first and second device regions; and patterning the silicon-containing layer, the metallic layer, the rare earth metal-containing or alkaline earth metal-containing layer, the high k gate dielectric layer, the interfacial layer, and the gate dielectric layer to form first and second gate stacks.

Other aspects, features and advantages of the invention will be more fully apparent from the ensuing disclosure and appended claims.

DETAILED DESCRIPTION OF THE INVENTION AND PREFERRED EMBODIMENTS THEREOF

Figure 1:
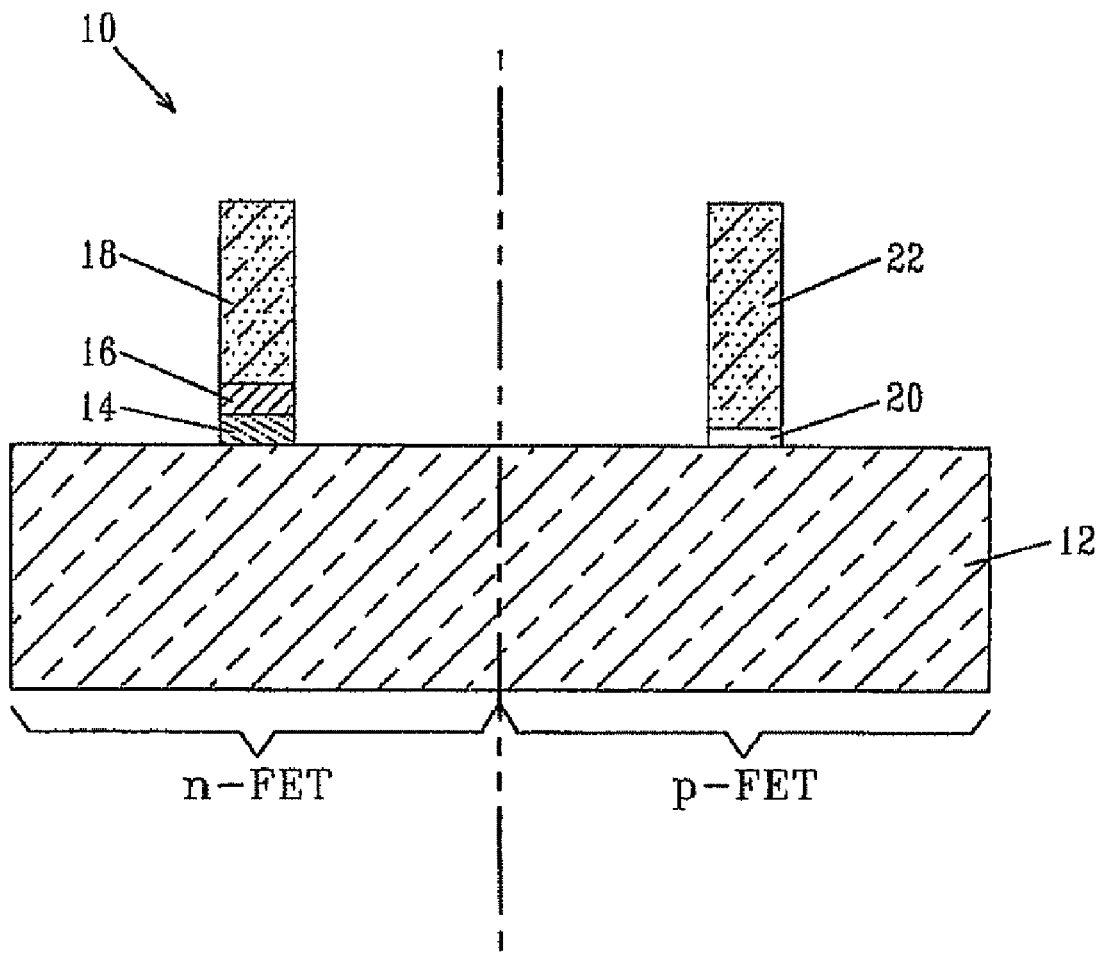
FIG. 1 shows a cross-sectional view of a patterned n-FET gate stack and a patterned p-FET gate stack located next to each other, according to one embodiment of the present invention. Specifically, the patterned n-FET gate stack comprises, from bottom to top, a high k gate dielectric, a metal gate conductor, and a polysilicon gate conductor. The patterned p-FET gate stack comprises, from bottom to top, a gate dielectric and a polysilicon gate conductor.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element there are no intervening elements present.

The present invention provides an improved semiconductor device, e.g., a CMOS circuit, which contains an integrated, heterogeneous (or hybrid) gate configuration for the n-FET and p-FET gate structures. Specifically, the n-FET gate stack in the CMOS circuit of the present invention comprises at least, from bottom to top, a gate dielectric layer, a metallic gate conductor, and a silicon-containing gate conductor. On the other hand, the p-FET gate stack, in such a CMOS circuit comprises, from bottom to top, a conventional gate dielectric layer and a conventional silicon-containing gate conductor. Preferably, but not necessarily, the gate dielectric layer of the n-FET gate stack comprises a high k gate dielectric material with a dielectric constant greater than that of silicon dioxide. Alternatively, the gate dielectric layer of the n-FET gate stack may comprise a gate dielectric material with a dielectric constant equal to that of silicon dioxide.

Such a heterogeneous or hybrid gate configuration provides, on one hand, a band edge n-FET gate stack of metallic gate with an inversion thickness (Tinv) of about 14 Å and high electron mobility, which function to achieve a performance boost for the CMOS circuit over the conventional n-FET gate stack of polysilicon gate having a Tinv of about 18 Å. On the other hand, such a heterogeneous or hybrid gate configuration provides a p-FET gate stack of conventional polysilicon gate, thereby overcoming the vacancy and thermal instability problems that are typically associated with p-FET gate stacks that contain metallic gates.

Further, since the p-FET performance can be improved by substrate engineering using substrates of hybrid crystal orientations (i.e., the HOT technologies as described by U.S. patent application Ser. No. 10/250,241 filed on Jun. 17, 2003 for "HIGH PERFORMANCE CMOS SOI DEVICES ON HYBRID CRYSTAL-ORIENTED SUBSTRATES," which was published on Dec. 23, 2004 as US Patent Application Publication No. 2004/0256700, and U.S. patent application Ser. No. 10/932,982 filed on Sep. 2, 2004 for "ULTRA-THIN SILICON-ON-INSULATOR AND STRAINED-SILICON-DIRECT-ON-INSULATOR WITH HYBRID CRYSTAL ORIENTATIONS," which was published on Mar. 3, 2005 as U.S. Patent Application Publication No. 2005/0045995, the contents of which are incorporated herein by reference in their entirety for all purposes), the heterogeneous or hybrid gate configuration proposed by the present invention is particularly useful for achieving improved device performance when used in conjunction with substrates of suitable hybrid crystal orientations.

An exemplary CMOS circuit 10 of the present invention is illustrated in FIG. 1, which comprises a semiconductor substrate 12 having at least one n-FET device region and at least one p-FET device region adjacent to each other. A first gate stack, i.e., an n-FET gate stack, is located over the semiconductor substrate 12 in the n-FET device region and comprises, from bottom to top, a gate dielectric layer 14 (which is preferably a high k gate dielectric layer), a metallic gate conductor 16, and a silicon-containing gate conductor 18. A second gate stack, i.e., a p-FET gate stack, is located over the semiconductor substrate 12 in the p-FET device region and comprises, from bottom to top, a gate dielectric layer 20 and a silicon-containing gate conductor 22.

Note that in FIG. 1, which is not drawn to scale, only one n-FET gate stack and one p-FET gate stack are shown on the semiconductor substrate 12. Although illustration is made to such an embodiment, the present invention is not limited to any specific number of n-FET and p-FET gate stacks. Further, the semiconductor devices of the present invention may also contain other logic circuitry components, such as resistors, diodes, planar capacitors, varactors, etc., in addition to the n-FETs and p-FETs.

The semiconductor substrate 12 employed in the present invention comprises any semiconductor material including, but not limited to: Si, Ge, SiGe, SiC, SiGeC, Ga, GaAs, InAs, InP and all other III/V or II/VI compound semiconductors. Semiconductor substrate 12 may also comprise an organic semiconductor or a layered semiconductor such as Si/SiGe, a silicon-on-insulator (SOI) or a SiGe-on-insulator (SGOI). In some embodiments of the present invention, it is preferred that the semiconductor substrate 12 be composed of a Si-containing semiconductor material, i.e., a semiconductor material that includes silicon.

The semiconductor substrate 12 may be doped, undoped or contain both doped and undoped regions therein. The semiconductor 12 may also include a first doped (n- or p-) region and a second doped (p- or n-) region. For clarity, the doped regions are not specifically shown in the drawings of the present invention. The first doped region and the second doped region may be the same, or they may have different conductivities and/or doping concentrations. These doped regions are known as "wells" and can be used to define various device regions.

In a particularly preferred embodiment of the present invention, the semiconductor substrate 12 is a hybrid substrate, which comprising at least one region (e.g., the n-FET device region) in which mobility of electrons is enhanced, and another region (e.g., the p-FET device region) in which mobility of holes is enhanced. By fabricating the n-FET in the electron-mobility-enhanced region and the p-FET in the hole-mobility-enhanced region, the mobility of the respective charge carriers (i.e., either electrons or holes) in the n-FET and p-FET device regions can simultaneously be enhanced, thereby improving the CMOS device performance.

More specifically, the semiconductor substrate 12 is a hybrid substrate that comprises different regions of different crystal orientations (which is referred to herein as a hybrid crystal orientation substrate). Functionality of such hybrid crystal orientation substrates is based on the anisotropy of carrier mobility in the semiconductor crystals. Specifically, the mobility of charged carries such as electrons and holes varies with the crystal orientation of the semiconductor substrate. For example, hole mobility is enhanced for a (110) surface in comparison to a (100) surface in silicon substrate, but electron mobility is enhanced for the (100) silicon surface as compared to the (110) surface. Therefore, by fabricating the n-FET in a device region having the (100) surface crystal orientation, and the p-FET in a different device region having the (110) surface crystal orientation, the mobility of the respective charge carriers (i.e., either electrons or holes) in the n-FET and p-FET device regions are both enhanced. Such carrier mobility anisotropy also exists in other semiconductor materials, such as other group IV semiconductor materials as well as group III-V and II-VI compounds, and the hybrid crystal orientation technology (which is typically referred to as the HOT technology) therefore is readily applicable to substrates composed of such other semiconductor materials. The hybrid crystal orientation substrate can be formed for example, by a method that includes wafer bonding, selective etching and regrowth of a semiconductor layer, as described, for example, in U.S. patent application Ser. Nos. 10/250,241 and 10/932,982, the content of which is incorporated herein by reference in its entirety for all purposes.

At least one isolation region (not shown) is typically provided in the semiconductor substrate 12 to isolate the adjacent n-FET and p-FET device regions from each other. The isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process.

The gate dielectric layer 14 of the n-FET gate stack preferably, but not necessarily, comprises a high k gate dielectric material with a dielectric constant greater than or equal to that of silicon dioxide (approximately 4.0). More preferably, the gate dielectric layer 14 comprises a hafnium-based high k dielectric material having a dielectric constant greater than about 10.0. Such hafnium-based dielectric material can be selected from hafnium oxide ($HfO_2$), hafnium silicate ($HfSiO_x$), hafnium silicon oxynitride (HfSiON), a mixture of hafnium oxide and zirconium oxide ($ZrO_2$), or multilayers thereof. More preferably, the gate dielectric layer 14 of the n-FET gate stack comprises hafnium oxide or hafnium nitride. In some embodiments, the hafnium-based gate dielectric layer 14 can be replaced by, or used in conjunction with, other dielectric materials having a dielectric constant (k) of greater than or equal to about 4.0, more typically greater than or equal to about 7.0. The other dielectric materials can be, for example, semiconductor oxides, semiconductor oxynitrides, metal oxides or mixed metal oxides that are well known to those skilled in the art, and they can be formed utilizing any of the techniques described hereinafter for forming the gate dielectric layer 14.

The hafnium-based gate dielectric layer 14 can be formed on the surface of the semiconductor substrate 12 by a deposition process such as, for example, chemical vapor deposition (CVD), plasma-assisted CVD, physical vapor deposition (PVD), metalorganic chemical vapor deposition (MOCVD), atomic layer deposition (ALD), evaporation, reactive sputtering, chemical solution deposition and other like deposition processes. The hafnium-based gate dielectric layer 14 may also be formed utilizing any combination of the above-described processes.

The physical thickness of the hafnium-based gate dielectric layer 14 may vary, but typically, the layer 14 has a thickness form about 0.5 to about 10 nm, with a thickness from about 0.5 to about 3 nm being more typical.

The metallic gate conductor 16 preferably comprises a metallic material, such as a metal nitride or a metal silicon nitride, which contains a Group IVB or VB metal. More specifically, the metallic gate conductor 16 comprises a metal selected from the group consisting of Ti, Zr, HE, V, Nb, or Ta, with Ti or Ta being highly preferred. For example, the metallic gate conductor 16 preferably comprises TiN or TaN. In addition, the metallic gate conductor 16 of the present invention may comprise a ternary alloy of Ti-AE-N ("AE" stands for alkaline earth metal), a ternary alloy of Ta-AE-N, a ternary alloy of Ti-RE-N ("RE" stands for rare earth metal), a ternary alloy of Ta-RE-N, or a stack containing mixtures thereof.

The metallic gate conductor 16 may comprise a single metallic layer, or it may comprise multiple metallic layers of different metallic compositions. Preferably, the metallic gate conductor 16 further comprises a workfunction defining metal layer (not shown) within one of the device regions between a first metallic layer (not shown) and the silicon-containing gate conductor 18. By "workfunction defining metal" it is meant a metal layer that can be used to adjust or set the workfunction of the crate stack. For n-type workfunctions, the workfunction defining metal comprises at least one element from Groups IIIB, IVB or VB of the Periodic Table of Elements (the nomenclature of the elements is based on the CAS version). Elements within the Lanthanide Series (e.g., La, Ce, Pr, Nd, Pm, Sm, Eu, Gd, Th, Dy, Ho, Er, Tm, Yb or Lu) also contemplated herein. Illustrative examples of metal that can be used in providing an n-type workfunction to a conductive electrode comprise, but are not limited to: Sc, Y, La, Zr, Hf, V, Nb, Ta, Ti and elements from the Lanthanide Series. Preferably, the workfunction defining metal used in providing the n-type workfunction shift is one of elements from the Lanthanide group. For p-type workfunctions, the workfunction defining metal comprises at least one element from Groups VIB, VIIB and VIII of the Periodic Table of Elements (the nomenclature of the elements is based on the CAS version). Illustrative examples of metals that can be used in providing a p-type workfunction to a conductive electrode comprise, but are not limited to: Re, Fe, Ru, Co, Rh, Ir, Ni, Pd, and Pt. Preferably, the workfunction defining metal used in providing the p-type workfunction shift is one of Re, Ru or Pt.

The metallic gate conductor 16 can be readily formed using a conventional deposition process, such as CA/D, PVD, ALD, sputtering or evaporation. The physical thickness of the metallic conductor 16 may vary, but typically, the metallic conductor 16 has a thickness from about 0.5 to about 200 nm, with a thickness from about 5 to about 80 nm being more typical.

The gate dielectric layer 20 of the p-FET gate stack preferably comprises a conventional gate dielectric material, such as semiconductor oxide, semiconductor oxynitride, metal oxide such as $Al_2O_3$, AlON, AlN, and combinations and multilayers thereof. High k dielectric materials, as described hereinabove, can also be used to form the gate dielectric layer 20. The gate dielectric layer 20 can be formed by a thermal growing process such as, for example, oxidation or oxynitridation. Alternatively, the gate dielectric layer 20 can be formed by a deposition process such as CVD, PVD, ALD, evaporation, reactive sputtering, chemical solution deposition, or any other suitable deposition processes. The gate dielectric layer 20 may also be formed utilizing any combination of the above processes. The physical thickness of the gate dielectric layer 20 may vary, but typically, the gate dielectric layer 20 has a thickness from about 0.5 to about 10 nm, with a thickness from about 0.5 to about 3 nm being more typical.

The silicon gate conductors 18 and 22 of the n-FET and p-FET gate stacks may include Si or a SiGe alloy in polycrystalline, or amorphous form, with polycrystalline Si or SiGe being more typical. Such silicon gate conductors 18 and 22 can be formed by depositing one or more blanket layers of a Si-containing material utilizing known deposition processes, such as, for example, CVD, PVD, or evaporation. The Si-containing material layers can be either doped or undoped. If doped, an in-situ doping deposition process may be employed to form the same. Alternatively, a doped Si-containing layer can be formed by deposition, ion implantation, and annealing. The ion implantation and annealing can occur prior to or after a subsequent etching step that patterns die material stack. The doping of the Si-containing layer will shift the work function of the gate conductor so formed. The thickness, i.e., height, of the Si-containing gate conductors 18 and 22 may vary depending on the deposition process used. Typically, the Si-containing gate conductors 18 and 22 each has a vertical thickness from about 20 to about 180 nm, with a thickness from about 40 to about 150 nm being more typical.

The CMOS circuit 10 as shown in FIG. 1 can be readily formed in an integrated manner by various methods of the present invention, which will now be described in greater detail by referring to the exemplary processing steps shown in the accompanying FIGS. 2A-4E.

Specifically, FIGS. 2A-2I show exemplary processing steps for forming the n-FET and p-FET gate stacks of FIG. 1, by first forming the a semiconductor oxide or semiconductor oxynitride gate dielectric and a polysilicon gate conductor in the p-FET device region, followed by covering the p-FET device region with a protective capping layer during the high k dielectric and metal deposition in the n-FET device region, according to one embodiment of the present invention.

Figure 2A:
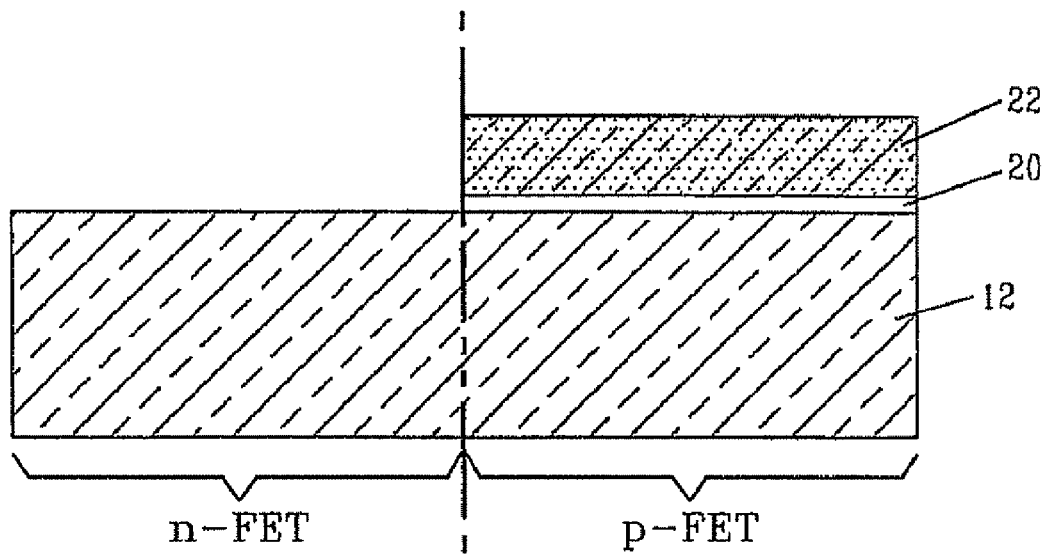
FIGS. 2A-2I show cross-sectional views that illustrate exemplary processing steps for forming the patterned n-FET and p-F ET gate stacks of FIG. 1, by first forming a gate dielectric and a polysilicon gate conductor in the p-FET device region, followed by covering the p-FET device region with a protective capping layer during the high k dielectric and metal deposition in the n-FET device region, according to one embodiment of the present invention.

Reference is first made to FIG. 2A, which shows a semiconductor substrate 12, which contains an n-FET device region and a p-FET device region that are located adjacent to each other and is preferably isolated from each other by a shallow trench isolation region (not shown). A gate dielectric layer 20 and a silicon-containing gate conductor 20 are selectively formed on the p-FET device region, but not the n-FET device region. Specifically, a blank gate dielectric layer 20 is first formed over both the n-FET and the p-FET device regions (not shown), preferably by a thermal oxide deposition process, followed by deposition of a blanket silicon-containing layer 22 over both the n-FET and the p-PET device regions (not shown). Portions of the layers 20 and 22 are then selectively removed from the n-FET device region (not shown), by one or more selective etching steps, such as soft/hard mask reactive ion etching (RIE), wet etching using a diluted hydrofluoric acid (UHF) etching solution, or any other suitable techniques.

Figure 2B:
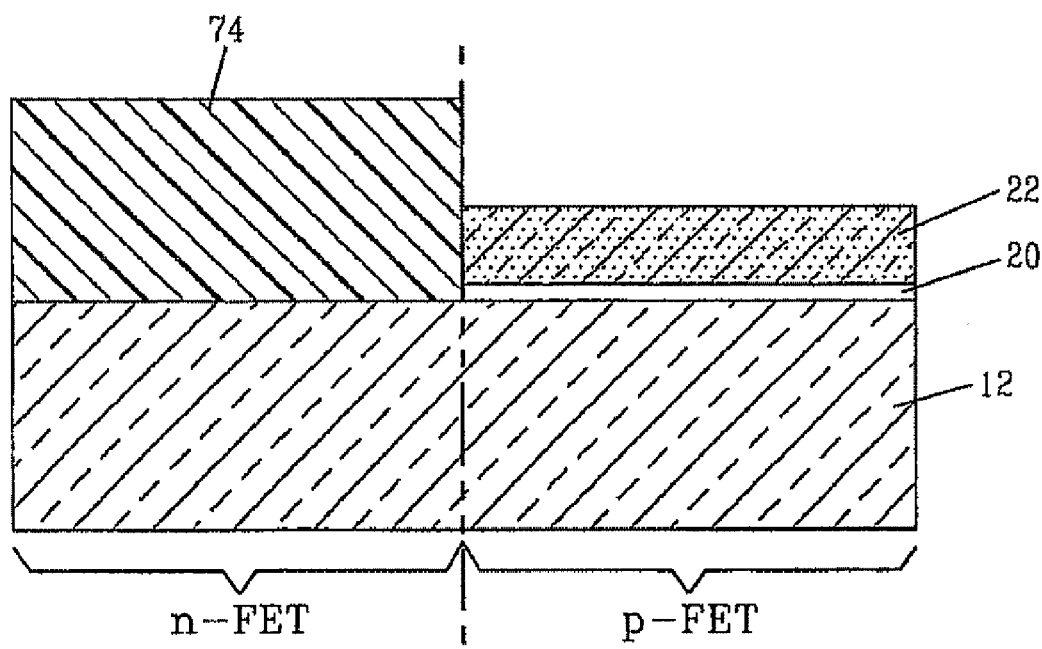
Figure 2C:
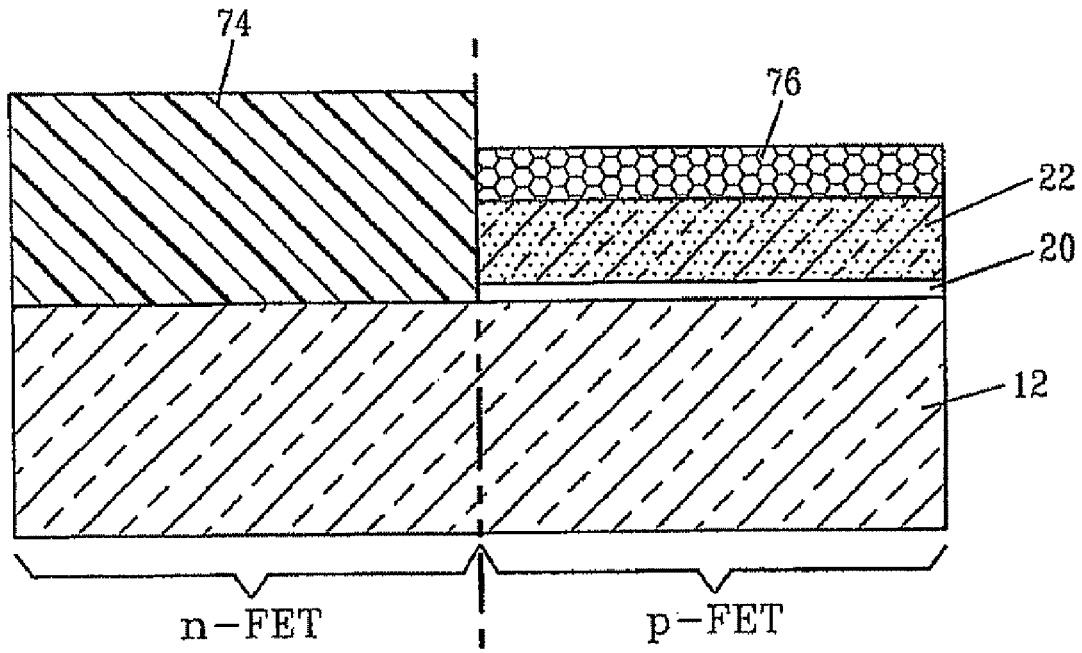

The n-FET device region is then selectively covered with a photoresist material 74, as shown in FIG. 2B, followed by formation of a protective material layer 76 over the silicon-containing gate conductor 22 in the p-FET device region, as shown in FIG. 2C. The protective material layer 76 comprises at least one silane deactivator that selectively binds to the silicon-containing gate conductor 22 to form a protective coating that suppresses the growth or deposition of materials on the silicon-containing gate conductor 22. Suitable silane deactivators that can be used for the practice of the present invention include silane species selected from the broad families of chlorosilanes, organofunctional silanes, and alkylsilanes. Specific examples of the silane deactivators include, but are not limited to: dimethyl diacetoxy silane, bis diamino dimethyl silane, dimethyl dichloro silane, dimethyl amino trimethyl silane, trichloro methyl silane, octadecyl trichloro silane, etc.

Figure 2D:
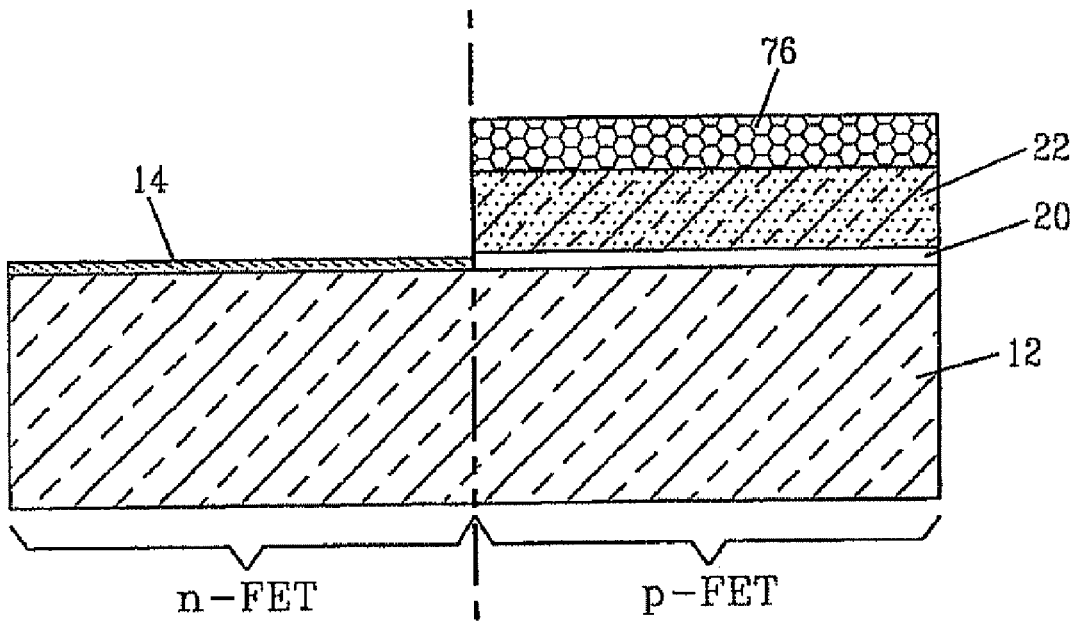
Figure 2E:
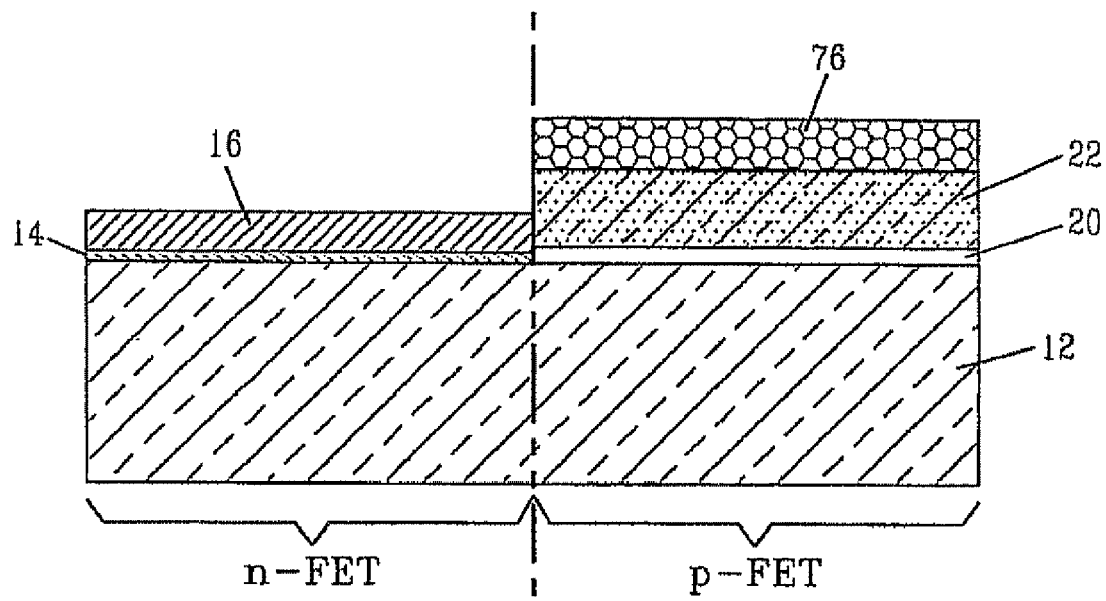

The photoresist material 74 is subsequently removed from the n-FET device region, and a gate dielectric layer 14 (preferably, but not necessarily, a high k gate dielectric layer with a dielectric constant greater than that of silicon dioxide) is deposited over the n-FET device region, as shown in FIG. 2D. A rare earth metal-containing (RE-containing) and/or an alkaline earth metal-containing layer (AE-containing) layer (not shown) can be formed over the n-FET device region either on top of or in place of the high k gate dielectric layer 14. Subsequently, a metallic layer 16 is formed over the n-FET device region, as shown in FIG. 2E. The protective material layer 76 alters the surface morphology of the silicon-containing gate conductor 22 in the p-FET device region, thereby preventing deposition of the high k gate dielectric layer 14, the RE/AE-containing layer (not shown), and the metallic layer 16 in the p-FET device region.

Figure 2F:
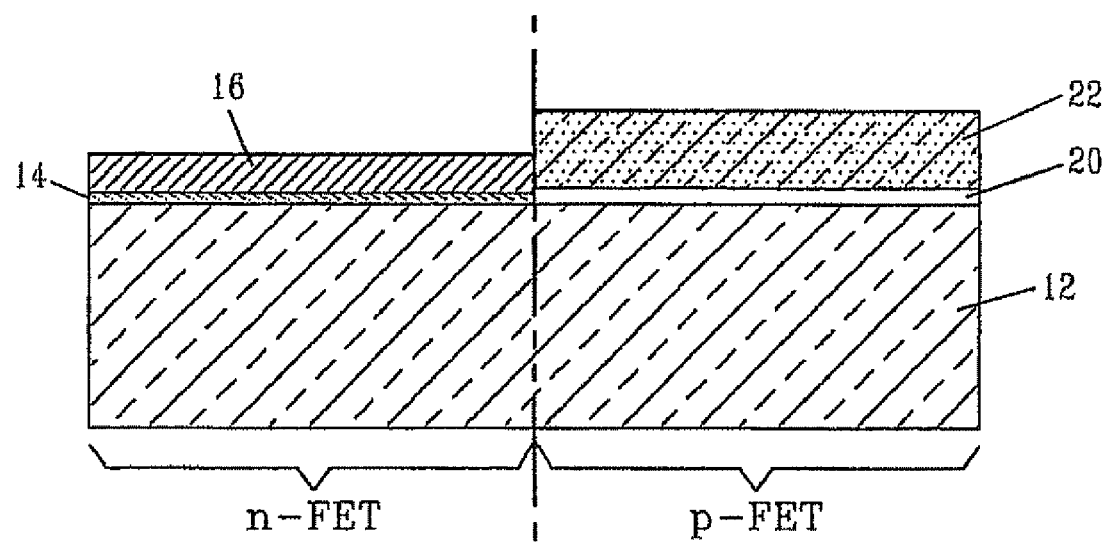
Figure 2G:
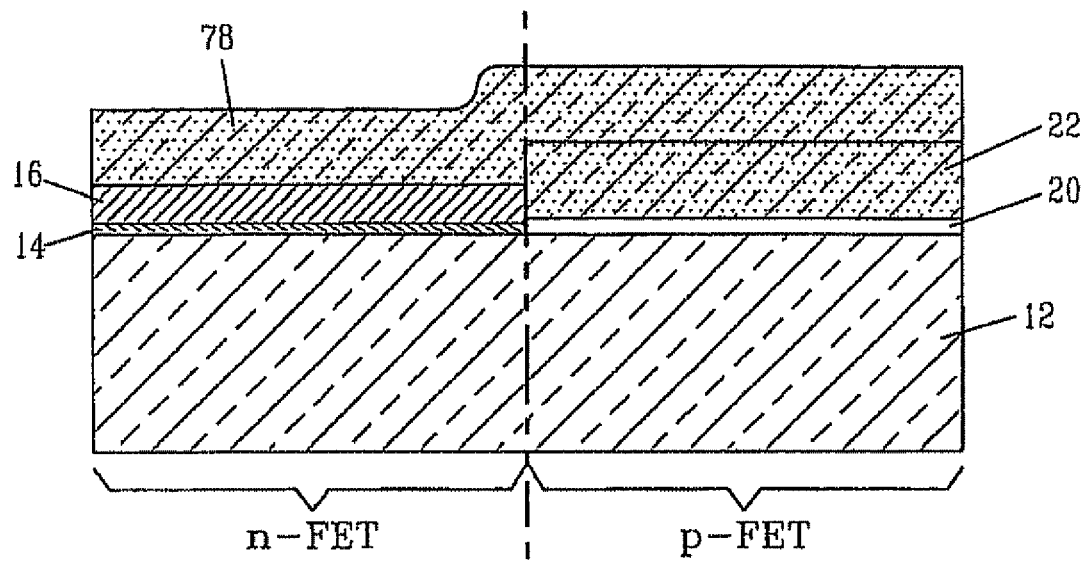

After deposition of the metallic layer 16 over the n-FET device region, the protective material layer 76 is removed from the p-FET device region, as shown in FIG. 2F, followed by deposition of a blanket silicon-containing layer 78 over both the n-FET and p-FET device regions, as shown in FIG. 2G.

Figure 2H:
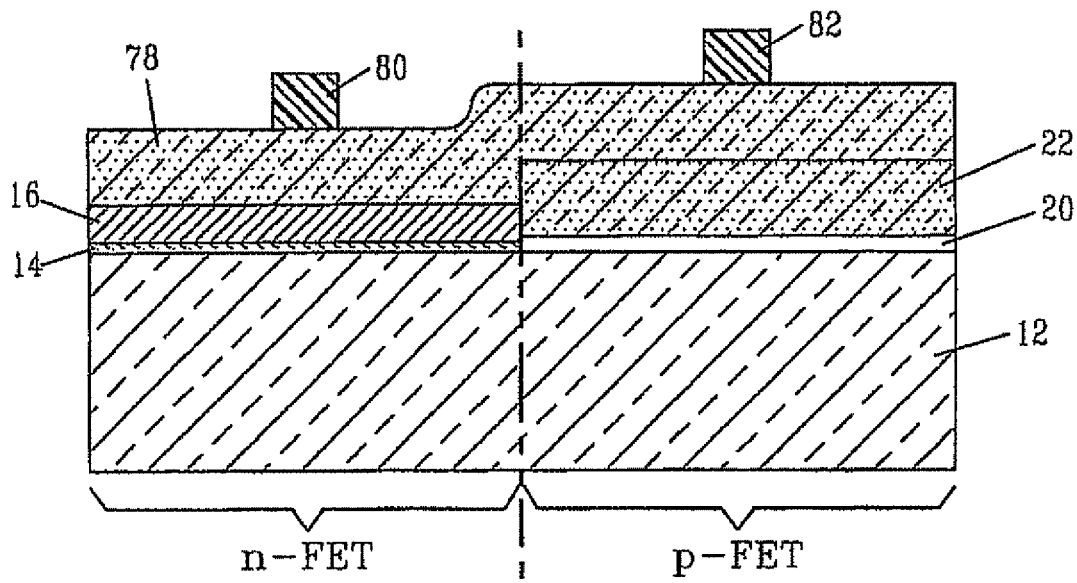
Figure 2I:
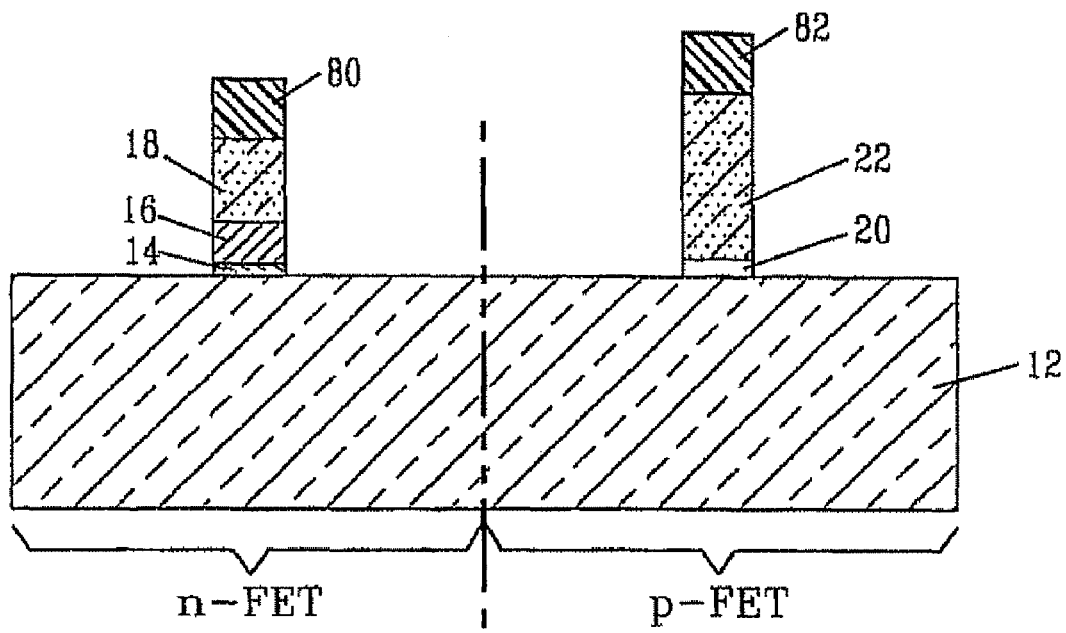

The blanket silicon-containing layer 78, the metallic layer 16, the high k gate dielectric layer 14, the silicon-containing gate conductor 22, and the gate dielectric 20 are then patterned by lithography and etching, so as to provide two or more patterned gate stacks, one for the n-FET and one for the p-FET. Specifically, patterned polyconductor (PC) resists 80 and 82 are respectively formed over the n-FET and p-FET device regions by gate level lithography, as shown in FIG. 2H. The pattern in such PC resists 80 and 82 is then transferred to the blanket silicon-containing layer 78, the metallic layer 16, the high k gate dielectric layer 14, the silicon-containing gate conductor 22, and the gate dielectric 20, utilizing one or more dry etching steps, to form the patterned n-FET and p-FET gate stacks as shown in FIG. 2I. Suitable dry etching processes that can be used in the present invention in forming the patterned gate stacks include, but are not limited to: reactive ion etching, (RIE), ion beam etching, plasma etching or laser ablation. The patterned PC resists 80 and 82 are removed after etching has been completed, resulting in the patterned n-FET and p-FET gate stacks as shown in FIG. 1.

FIGS. 3A-3E shows another set of exemplary processing steps for forming the patterned n-FET and p-FET gate stacks of FIG. 1, using a "metal first" approach, wherein the high k gate dielectric layer, the metallic gate conductor, and the silicon-containing gate conductor are first formed in the n-FET device region, followed by formation of the gate dielectric layer and the silicon-containing gate conductor in the p-FET device region by deposition and planarization, according to one embodiment of the present invention.

Figure 3A:
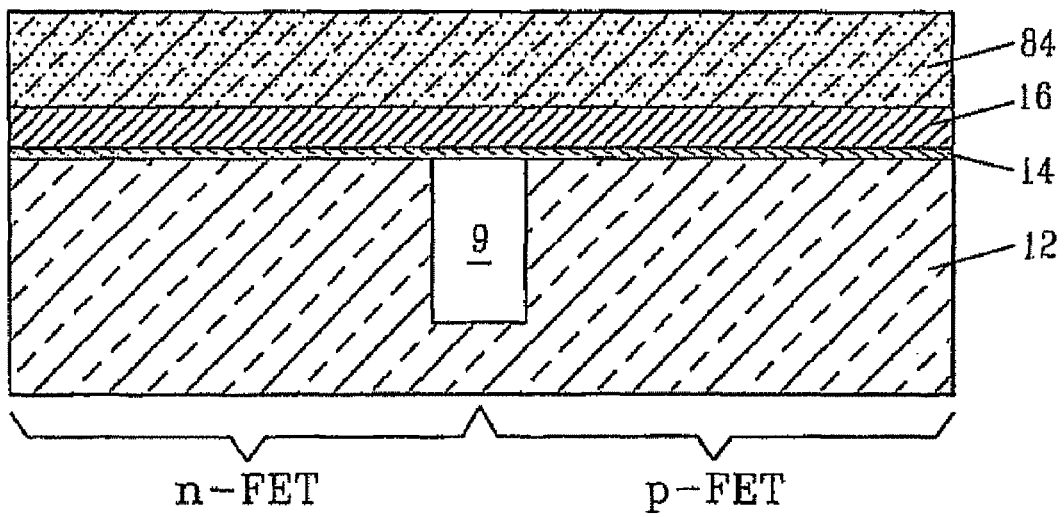
FIGS. 3A-3E shows cross-sectional views that illustrate exemplary processing steps for forming the patterned n-FET and p-FET gate stacks of FIG. 1, using a "metal first" approach wherein the high k gate dielectric layer, the metallic gate conductor, and the silicon-containing gate conductor are first formed in the n-FET device region, followed by formation of the gate dielectric layer and the silicon-containing gate conductor in the p-FET device region by deposition and planarization, according to one embodiment of the present invention.
Figure 3B:
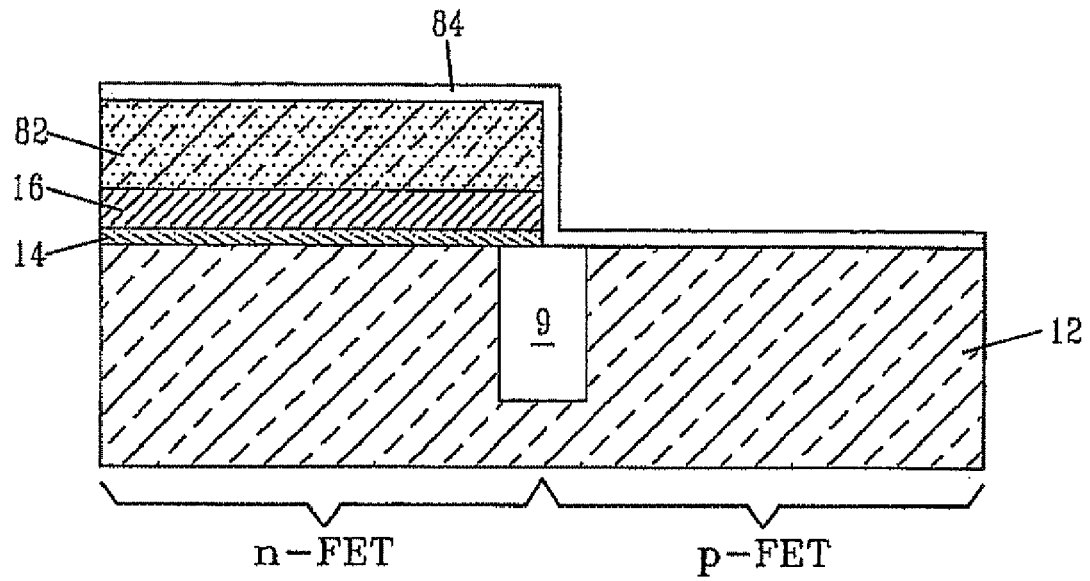

Specifically. FIG. 3A shows a semiconductor substrate 12, which contains an n-FET device region and a p-FET device region that are located adjacent to each other and is isolated by a shallow trench isolation region 9. A, high k gate dielectric layer 14, a metallic gate conductor layer 16, and a silicon-containing layer 84 are formed over both the n-FET and p-FET device regions, as shown in FIG. 3A. Subsequently, portions of the high k gate dielectric layer 14, the metallic gate conductor layer 16, and the silicon-containing layer 84 are selectively removed from the p-FET device region by a patterning technique, followed by deposition of a gate dielectric layer 84 over both the n-FET and p-FET device regions, as shown in FIG. 3B. The patterning is preferably carried out using a lithographic process, in which the n-FET device region is selectively blocked while the layered stack is removed from the p-FET device region.

Next, a blanket silicon-containing layer 86 is deposited over both the n-FET and the p-FET device regions, as shown in FIG. 5C, and a planarization step, such as a chemical mechanical polishing step, is then carried out to planarize the entire structure and to remove portions of the silicon-containing layer 86 and the gate dielectric layer 84 from the n-FET device region. Consequently, an upper surface of the first silicon-containing layer 82 is exposed in the planarized n-FET device region, and the exposed silicon-containing layer 82 is substantially coplanar with the un-removed portion of the silicon-containing layer 86 in the second device region, as shown in FIG. 3D).

Subsequently, a dielectric hard mask layer 88 is formed over both the silicon-containing layer 82 in the n-FET device region and the un-removed portion of the silicon-containing layer 86 in the second device region, and patterned photoresist structures 90 and 92 are deposited over the upper surface of the dielectric hard mask layer 88 by conventional lithographic techniques. The pattern in the photoresist structures 90 and 92 is then transferred to the dielectric mask layer 88, the silicon-containing gate conductor layer 82, the metallic gate conductor layer 16, the high k gate dielectric layer 14, the silicon-containing layer 86, and the gate dielectric layer 84, utilizing one or more dry etching steps, to forming the patterned n-FET and p-FET gate stacks as shown in FIG. 3E. Suitable dry etching processes that can be used in the present invention in forming the patterned gate stacks include, but are not limited to: reactive ion etching (RIE), ion beam etching, plasma etching or laser ablation.

The first pattern gate stack in the n-FET device region therefore comprises, from bottom to top, a high k gate dielectric layer 14, a metallic gate conductor 16, a silicon-containing gate conductor 18, and a patterned dielectric hard mask 88A, as shown in FIG. 3E. The second patterned gate stack in the p-FET device region therefore comprises, from bottom to top, a gate dielectric layer 20, a silicon-containing gate conductor 22, and a patterned dielectric hard mask 88B, as shown in FIG. 3E. The patterned dielectric hard masks 88A and 88B can be subsequently removed from the patterned gate stacks.

FIGS. 4A-4E show exemplary processing steps for forming the patterned n-FET and p-FET gate stacks of FIG. 1, which also employs a "metal first" approach similar to the process illustrated by FIGS. 3A-3E, with the exception that the subsequently formed silicon-containing layer 86 and the gate dielectric layer 84 are removed from the n-FET device region by one or more etching steps, instead of the planarization step described hereinabove.

Figure 3C:
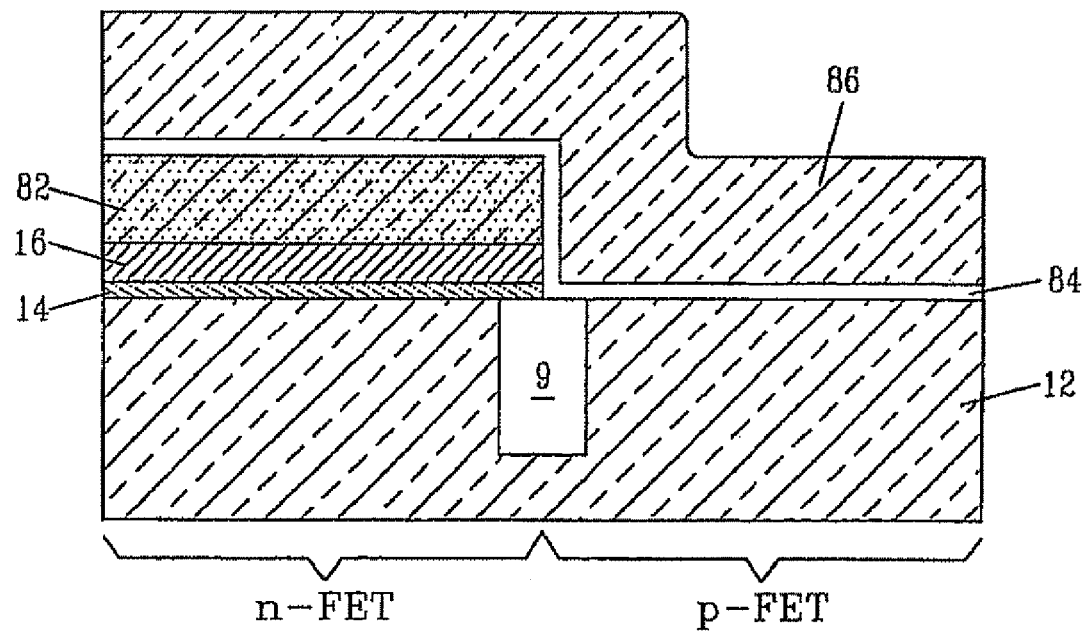
Figure 3D:
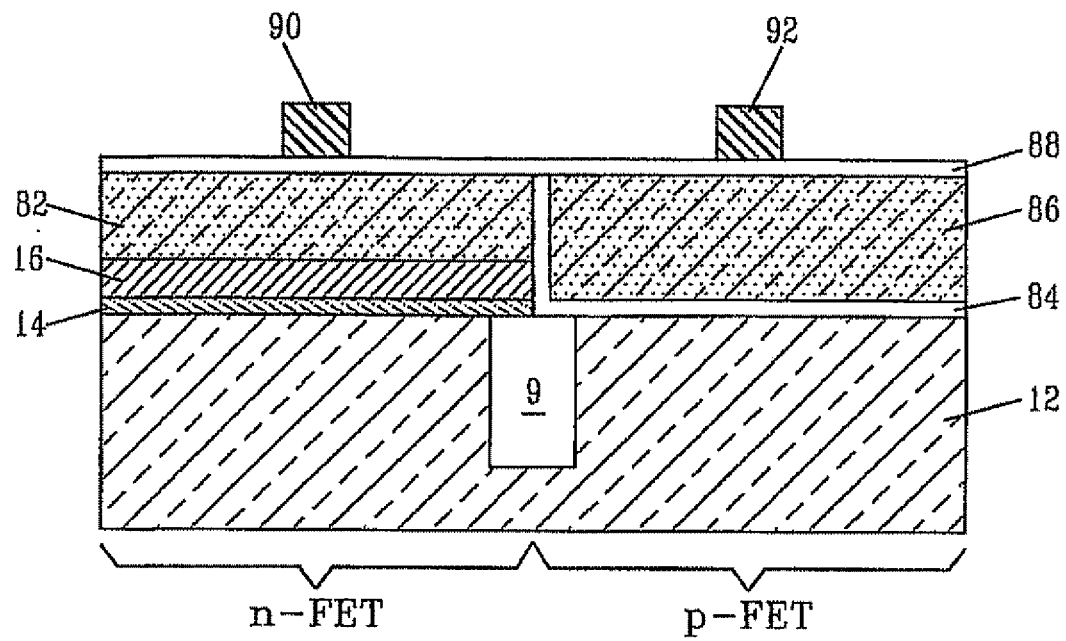
Figure 3E:
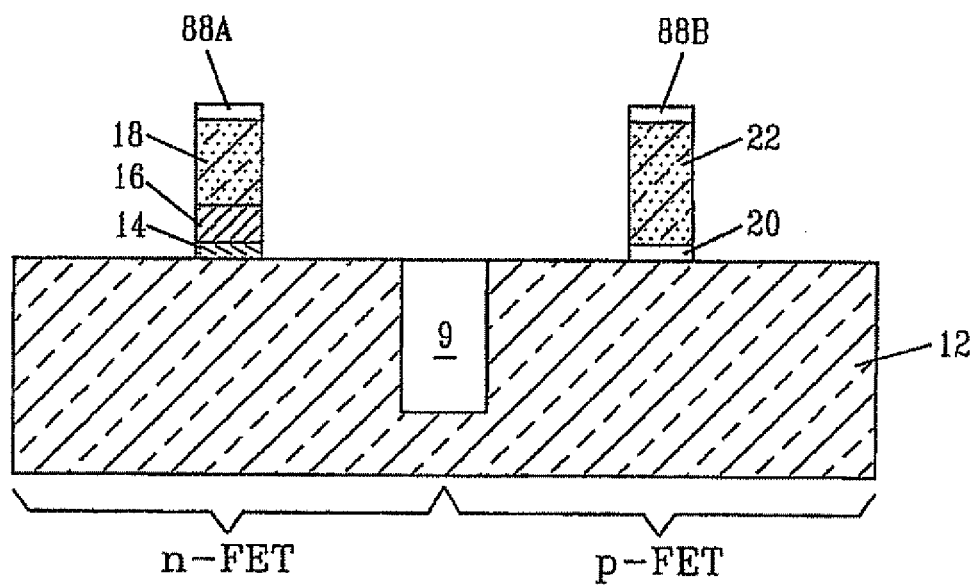
Figure 4A:
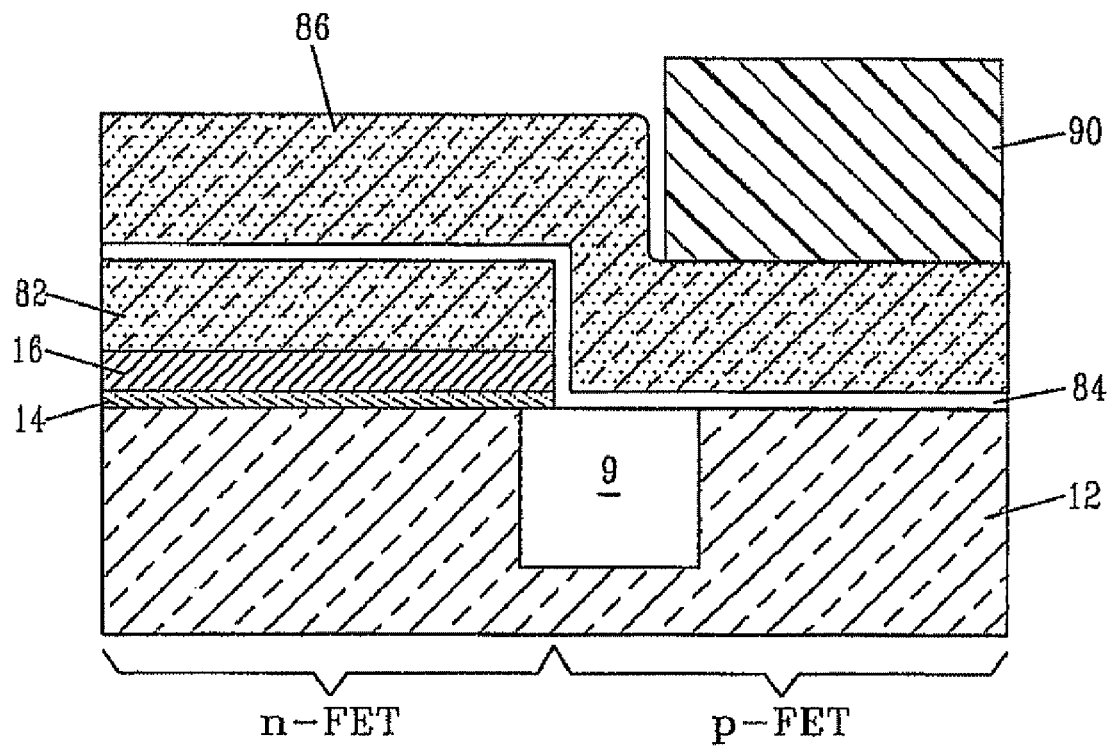
FIGS. 4A-4E show cross-sectional views that illustrate exemplary processing steps for forming the patterned n-FET and p-FET gate stacks of FIG. 1, using a "metal first" approach wherein the high k gate dielectric layer, the metallic gate conductor, and the silicon-containing gate conductor are first formed in the n-FET device region, followed by formation of the gate dielectric layer and the silicon-containing gate conductor in the p-FET device region by deposition and selective etching, according to one embodiment of the present invention.

Specifically, FIG. 4A shows selectively covering of the p-FET device region by a photoresist material 90, after the deposition of the blanket silicon-containing layer 86 (i.e., after the step illustrated by FIG. 3C). One or more selective etching steps are then carried out to remove portions of the silicon-containing layer 86 and the gate dielectric layer 84 from regions that are not covered by the photoresist material 90 (i.e., the n-FET device region and the STI region 9), as shown in FIG. 4B.

Preferably, a silicon-etching step (not shown) is first carried out to selective remove a portion of the silicon-containing layer 86 from the n-FET device region and the STI region 9. Such silicon-etching step stops on and exposes a portion of the underlying gate dielectric layer 84 in the n-FET device region and the STI region 9. Subsequently, the photoresist material 90 is removed from the p-FET device region, followed by an oxide stripping step to remove the exposed portion of the gate dielectric layer 84 from the n-FET device region and the STI region 9. The remaining portion of the gate dielectric layer 84 in the p-FET device region is covered by the remaining portion of the silicon-containing layer 86 and is therefore not removed by the oxide stripping.

Figure 4B:
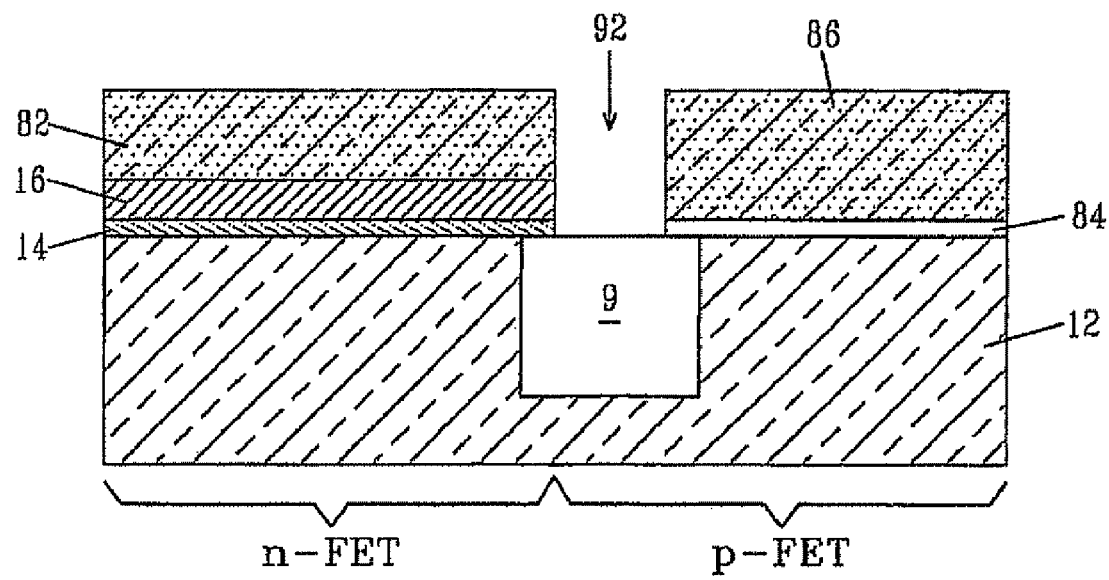

Because the photoresist material 90 in the p-FET device region is slightly offset from the silicon-containing gate conductor layer 82 in the n-PET device region, the selective etching results in a seam or trench 92 between the remaining portion of the silicon-containing layer 86 in the p-FET device region and the silicon-containing gate conductor layer 82 in the n-FET device region, as shown in FIG. 4B. The seam or trench 92 is preferably located over the STI region 9.

Figure 4C:
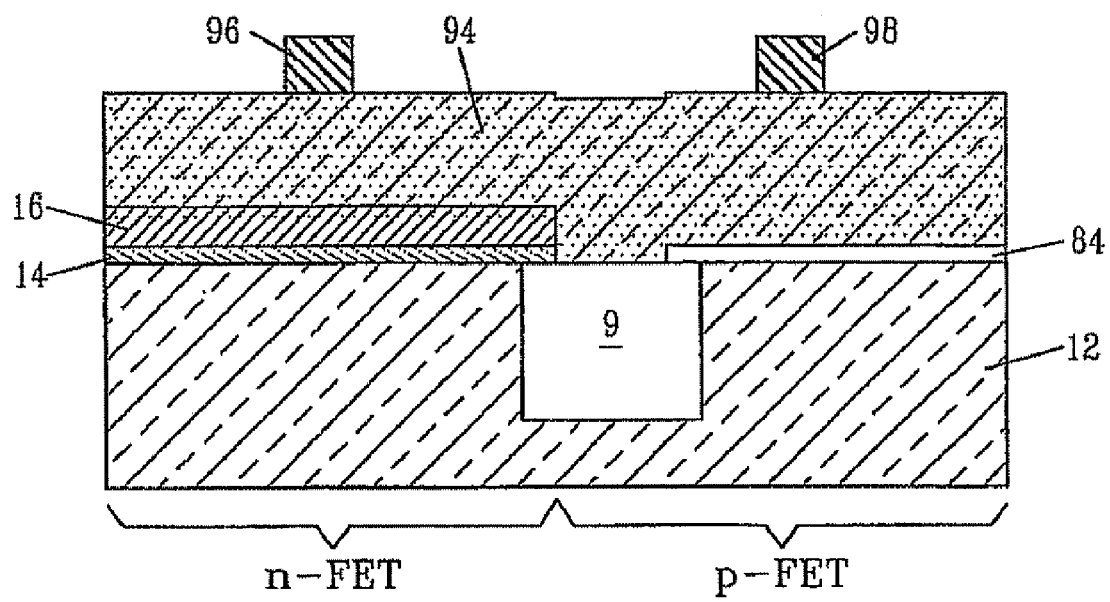

Next, a blanket silicon-containing layer 94 is deposited over both the n-FET and p-FET device regions, as shown in FIG. 4C. Such a blanket silicon-containing layer 94 fills the seam or trench 92 and forms a continuous silicon-containing structural layer 94 that incorporates both the silicon-containing layer 86 in the p-FET device region and the silicon-containing gate conductor layer 82 in the n-FET device region. Because the seam or trench 92 is located over the STI region 9, as describe hereinabove, the STI region 9 functions to electrically isolate the continuous silicon-containing structural layer 94 from the n-FET and p-FET device regions of the semiconductor substrate 12.

Figure 4D:
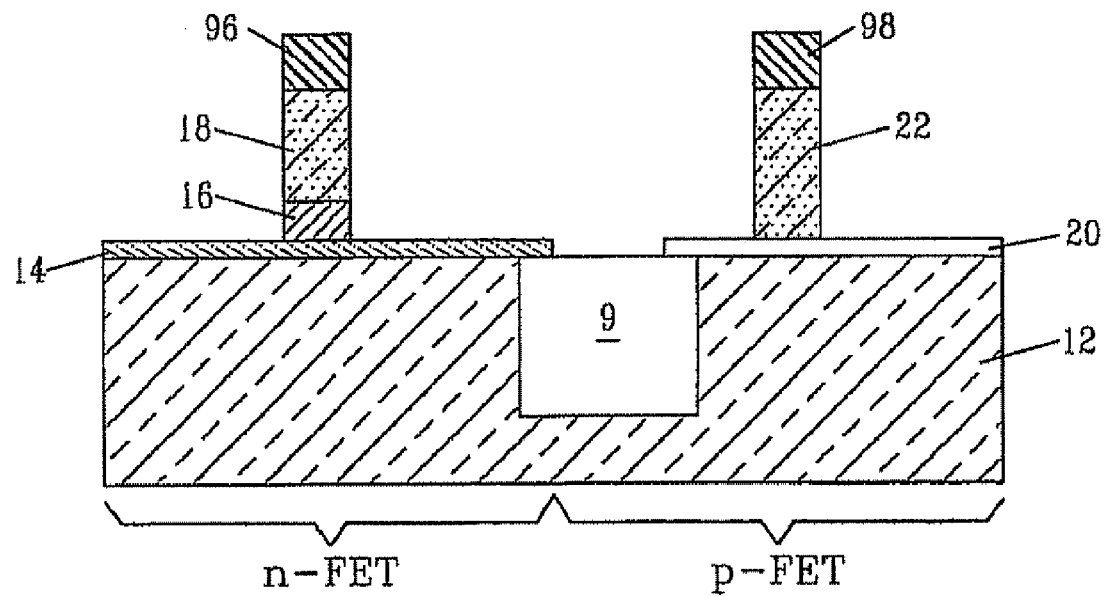

The continuous silicon-containing structural layer 94, the metallic layer 16, the high k gate dielectric layer 114, and the remaining portion of the gate dielectric 84 are then patterned by lithography and etching, so as to provide two or more patterned gate stacks, one for the n-FET and one for the p-FET. Specifically, patterned polyconductor (PC) resists 96 and 98 as shown in FIG. 4D are respectively formed over the n-FET and p-FET device regions by gate level lithography, and the pattern in the PC resists 96 and 98 is then transferred to the continuous silicon-containing structural layer 94, the metallic layer 16, the high k gate dielectric layer 14, and the gate dielectric 84, utilizing one or more dry and/or wet etching steps, forming the patterned n-PET and p-FET gate stacks as shown in FIG. 4D. Suitable dry etching processes that can be used in the present invention in forming the patterned gate stacks include, but are not limited to: reactive ion etching (RIE), ion beam etching, plasma etching or laser ablation. Suitable wet etching processes employ one or more etching solutions that can react with specific structural layers for removal of such layers.

Figure 4E:
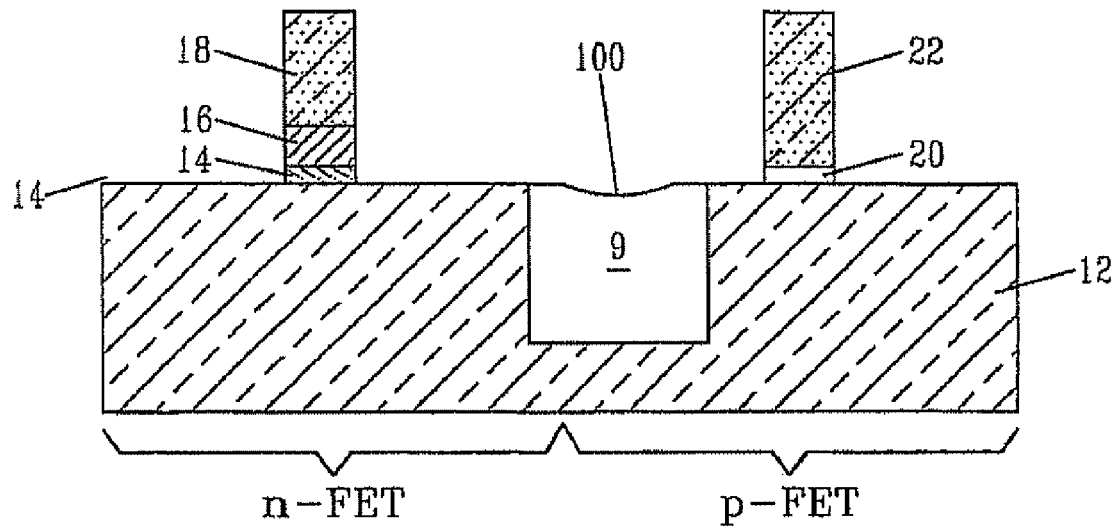

The patterned PC resists 96 and 98 are then removed after etching has been completed, resulting in the patterned n-FET and p-FET gate stacks that are respectively located in the n-FET and p-FET device regions, which are isolated by the STI region 9, as shown in FIG. 4E. Note that a recess 100 is formed in the STI region 9 during one or more of the etching steps.

Figure 5:
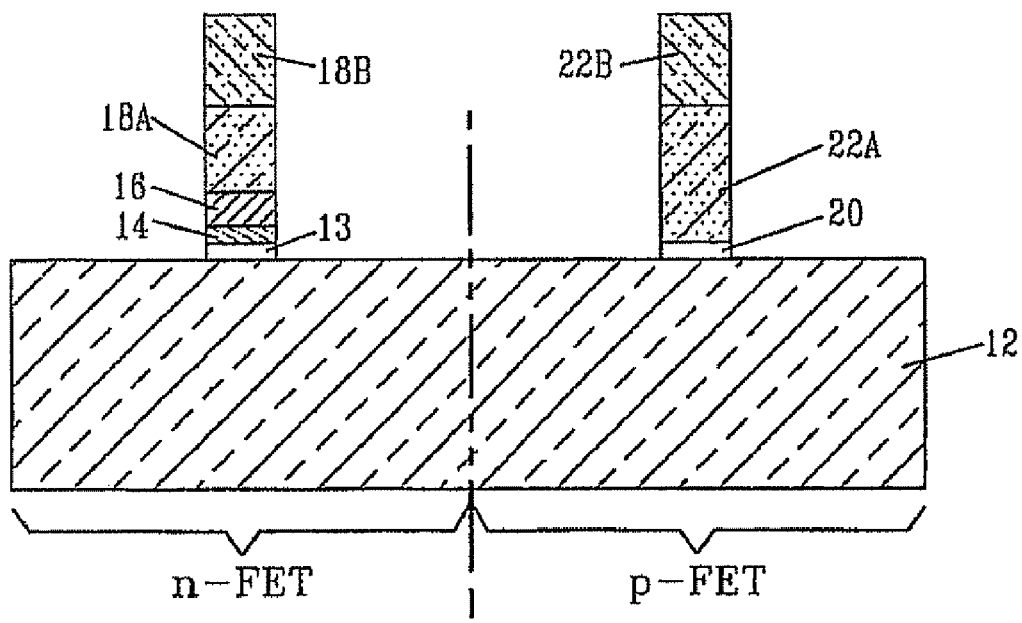
FIG. 5 shows a cross-sectional view of a patterned n-FET gate stack and a patterned p-FET gate stack located next to each other, according to one embodiment of the present invention. Specifically, the patterned n-FET gate stack comprises, from bottom to top, an interfacial layer, a high k gate dielectric layer, a metal gate conductor, a first polysilicon gate conductor, a second polysilicon gate conductor, and a cap layer. The patterned p-FET gate stack comprises, from bottom to top, a semiconductor oxide or semiconductor oxynitride gate dielectric, a first polysilicon gate conductor, a second polysilicon gate conductor, and a cap layer.

FIG. 5 shows a cross-sectional view of a patterned n-FET gate stack and a patterned p-FET gate stack located next to each other over a semiconductor substrate 12) according to one embodiment of the present invention. Specifically, the patterned n-FET gate stack comprises, from bottom to top, an interfacial layer 13, a high k gate dielectric layer 14, a metallic gate conductor 16, a first polysilicon gate conductor 18A, and a second polysilicon gate conductor 18B. The patterned p-FET gate stack comprises, from bottom to top, a semiconductor oxide or semiconductor oxynitride gate dielectric layer 20, a first polysilicon gate conductor 22A, and a second polysilicon gate conductor 22B. Such patterned n-FET and p-FET gate stacks as shown in FIG. 5 can be readily formed by a method containing; at least those exemplary process steps illustrated by FIGS. 6A-6H. The first and second polysilicon gate conductor 18A and 18B of the n-PET gate stack, which are formed by two separate processing steps as described hereinabove, may comprise polysilicon materials of either the same or different properties.

Figure 6A:
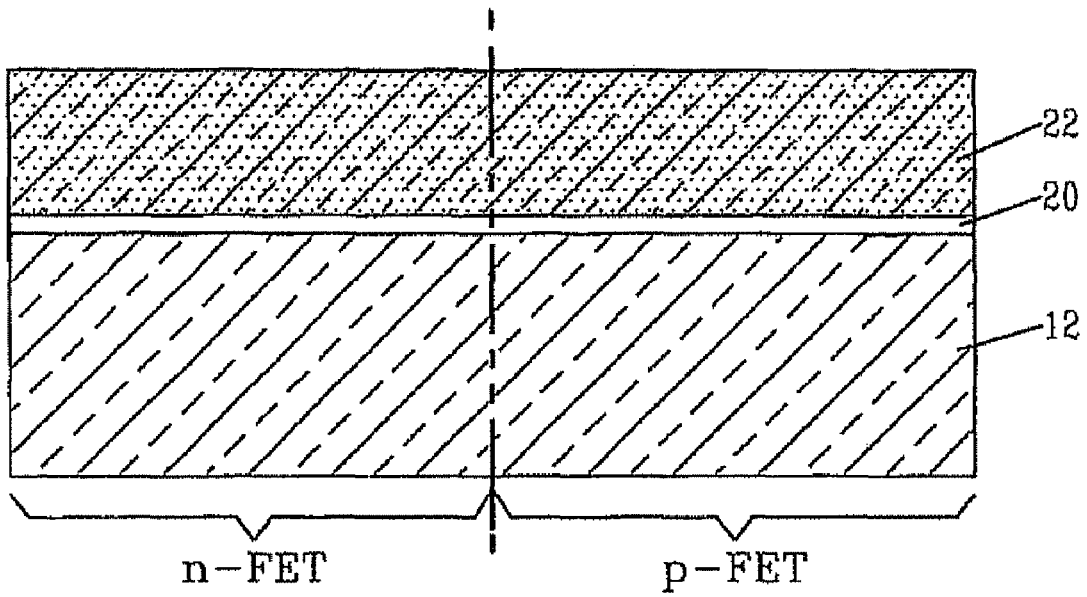
FIGS. 6A-6H show cross-sectional views that illustrate exemplary processing steps for forming the patterned n-PET and p-FET gate stacks of FIG. 5.
Figure 6B:
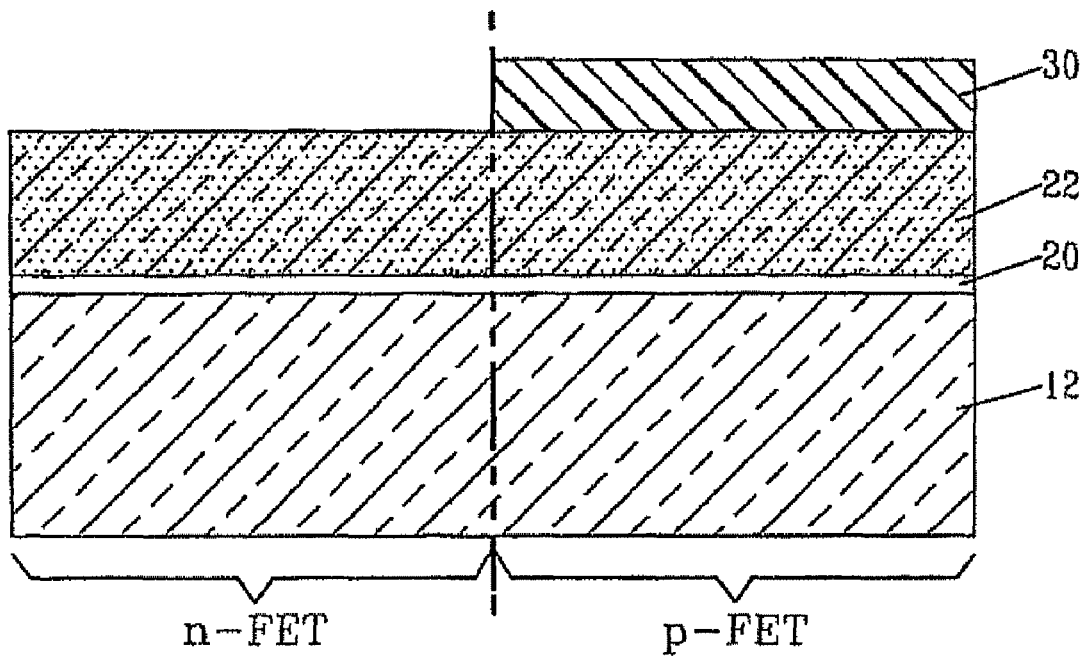
Figure 6C:
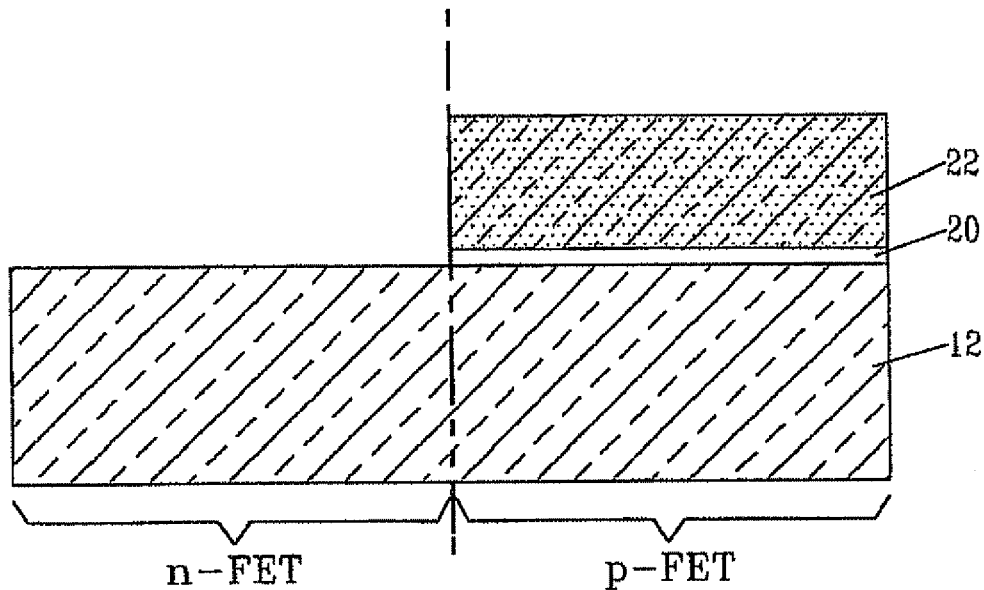

Specifically, FIG. 6A shows formation of a blanket gate dielectric layer 20 and a blanket silicon-containing gate conductor layer 22 over both the n-FET and p-FET device regions. A photoresist material 30 is then selectively formed over the p-FET device region, as shown in FIG. 6B. Portions of the layers 20 and 22 are then selectively removed from the n-FET device region (as shown in FIG. 6C) by one or more selective etching steps, such as soft/hard mask reactive ion etching (RIE), DHF wet etching, or any other suitable techniques.

Figure 6D:
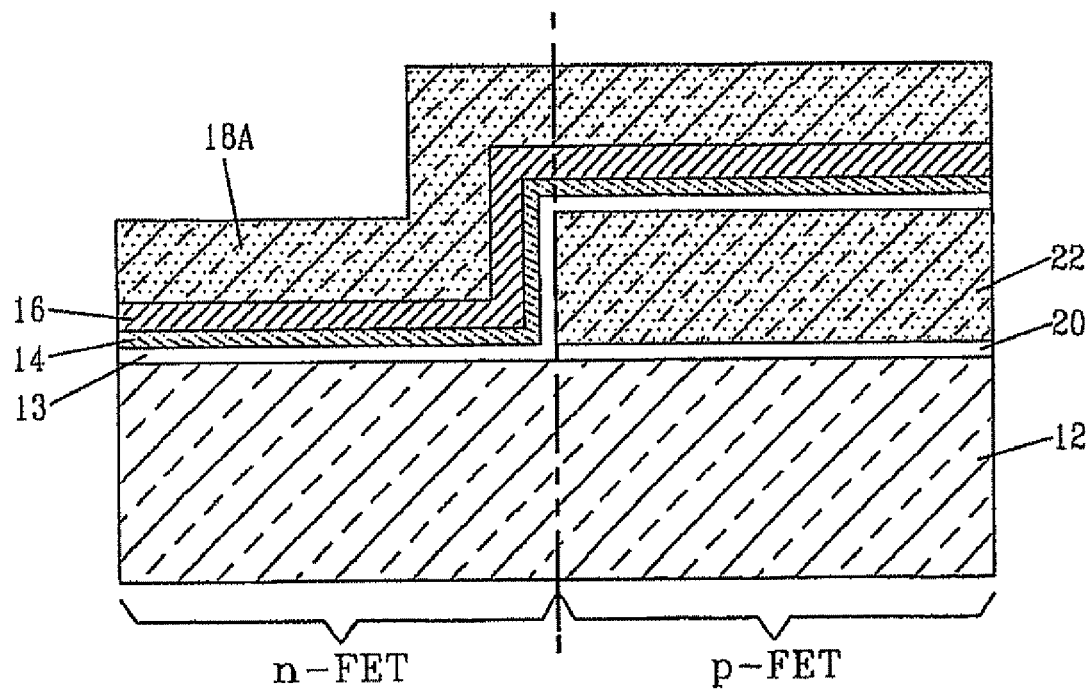

Subsequently, an interfacial layer 13, a high k dielectric layer 14, a metallic gate conductor layer 16, and a silicon-containing material layer 18A are deposited over both the n-FET and p-FET device regions, as shown in FIG. 6D).

The interfacial layer 13 is optionally formed on the surface of the semiconductor substrate 12 by chemical oxidation. The optional interfacial layer 13 is formed utilizing a conventional wet chemical process technique that is well known to those skilled in the art. Alternatively, the interfacial layer 13 may be formed by thermal oxidation, oxynitridation or by vapor deposition. When the substrate 12 is a Si-containing semiconductor, the interfacial layer 13 is comprised of chemical oxide grown by wet processing or thermally grown or deposited silicon oxide, silicon oxynitride or a nitrided silicon oxide. When the substrate 12 is other than a Si-containing semiconductor, the interfacial layer 13 may comprise a semiconducting oxide, a semiconducting oxynitride or a nitrided semiconducting oxide or any other interface dielectric such as, for example, one having a low interface trap density with the semiconducting material. The thickness of the interfacial layer 13 ranges typically from about 0.4 to about 1.2 nm, with a thickness from about 0.6 to about 1 nm being more typical. The thickness of the interfacial layer 13, however, may be different after processing at higher temperatures, which are usually required during CMOS fabrication.

In a specific embodiment of the present invention, the interfacial layer 13 is a semiconductor oxide layer having a thickness ranging from about 0.6 to about 1.0 nm that is formed by a wet chemical oxidation step. The wet chemical oxidation step includes treating a cleaned semiconductor surface with a mixture of ammonium hydroxide, hydrogen peroxide and water (in a 1:1:5 ratio) at 65° C. Alternatively, the interfacial layer 13 can also be formed by treating the semiconductor surface in ozonated aqueous solutions, with the ozone concentration ranging from about 2 parts per million (ppm) to about 40 ppm.

Figure 6E:
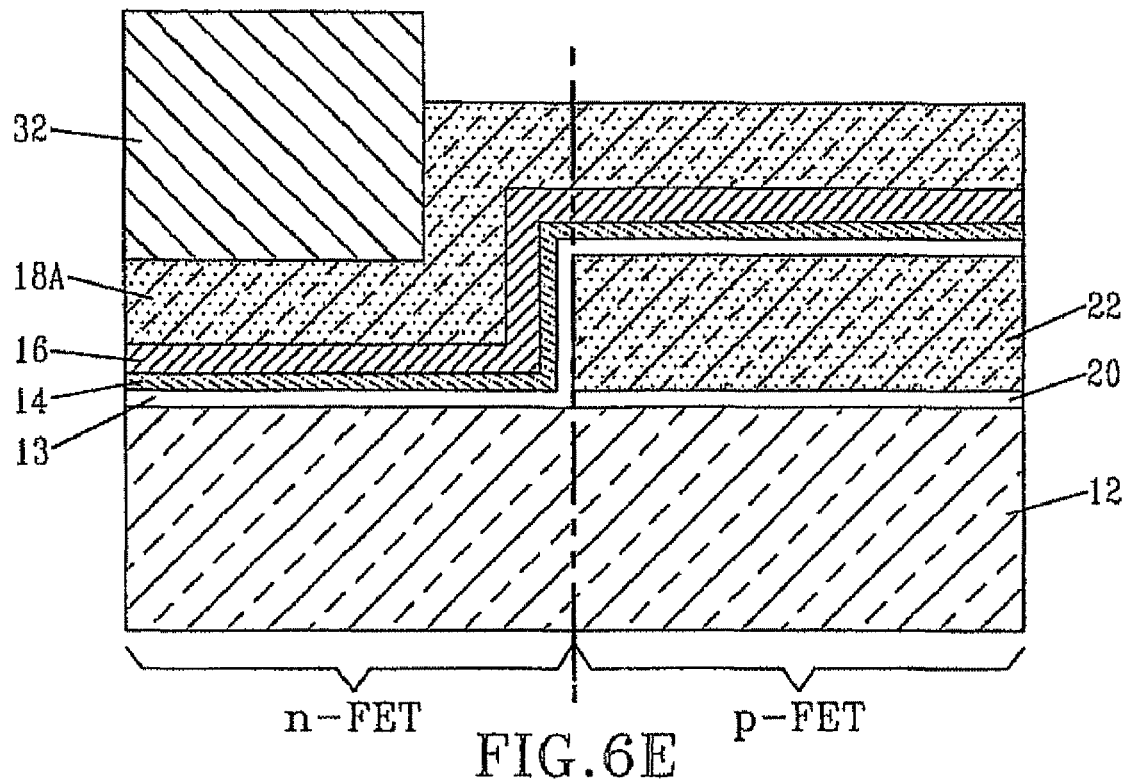
Figure 6F:
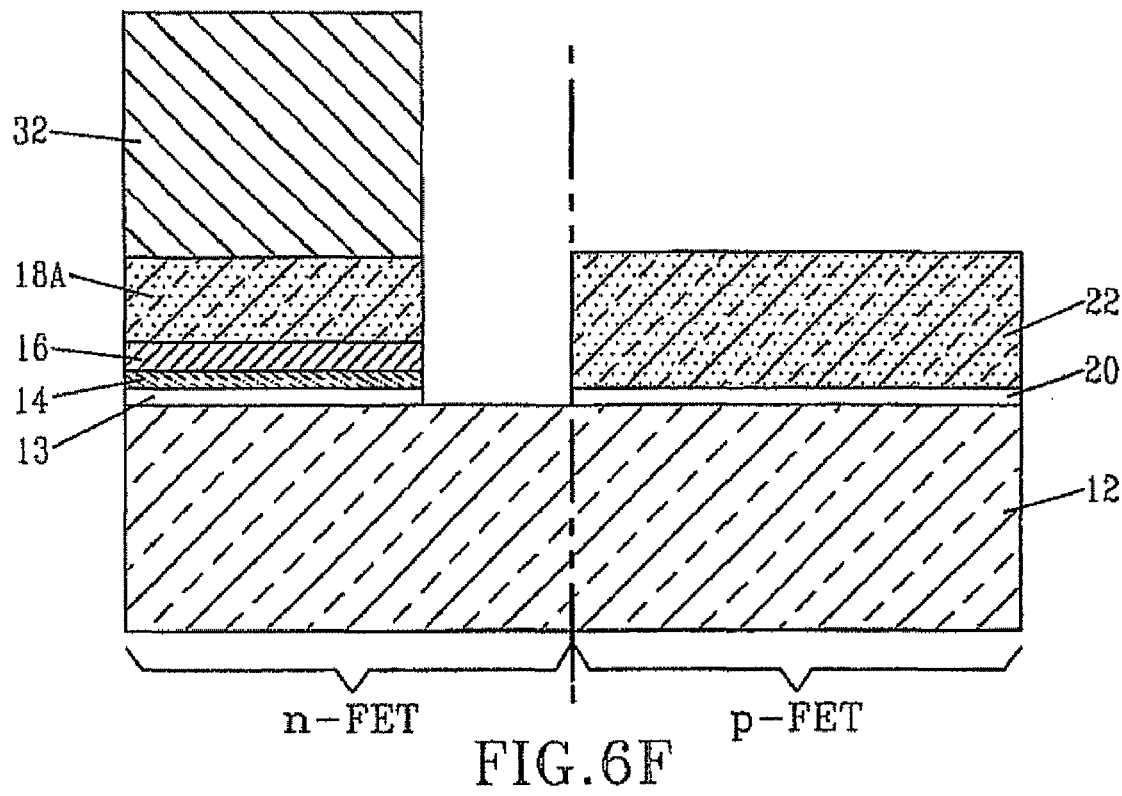

Subsequently, the n-FET device region is selectively covered by a photoresist material 32, as shown in FIG. 6E. The photoresist material 32 is then used as a mask for selectively removal of portions of the silicon-containing gate conductor layer 18A, the metallic gate conductor layer 16, the high k gate dielectric layer 14, and the interfacial layer 13 from the p-FET device region, as shown in FIG. 6F, via one or more selective etching steps, such as soft/hard mask reactive ion etching (RIE), wet etching, or any other suitable techniques.

Figure 6G:
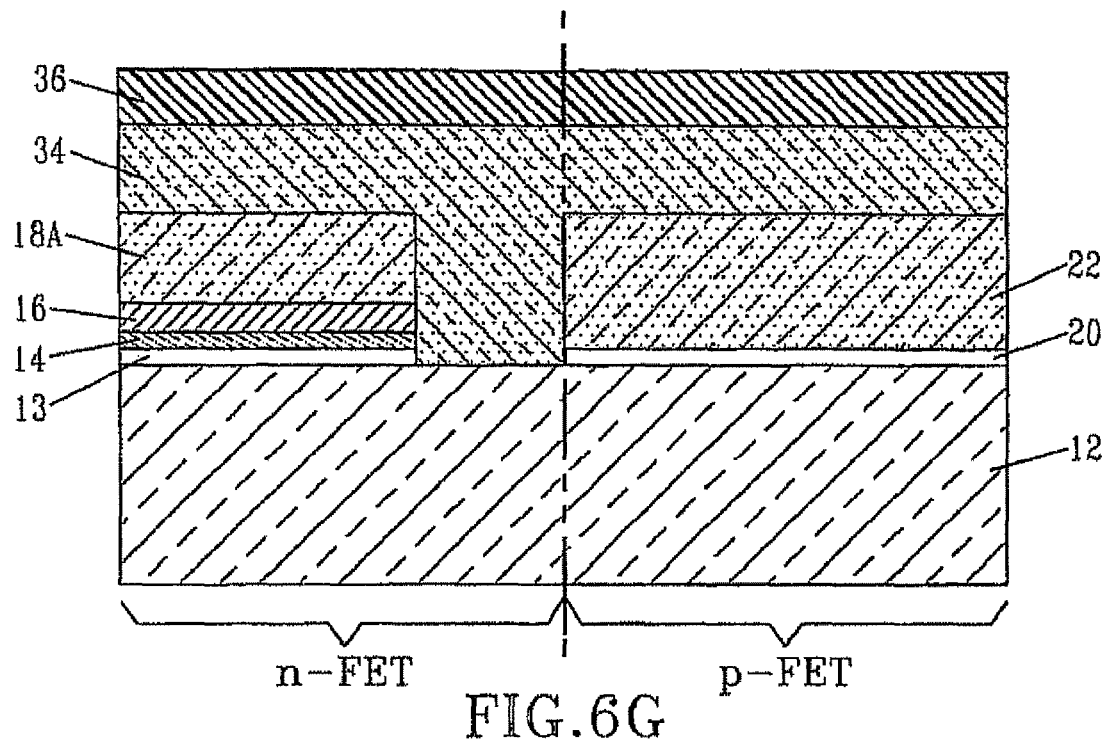

Next, a blanket silicon-containing material layer 34 and a dielectric hard mask layer 36 are formed over both the n-FET and the p-FET device regions, as shown in FIG. 6G.

Figure 6H:
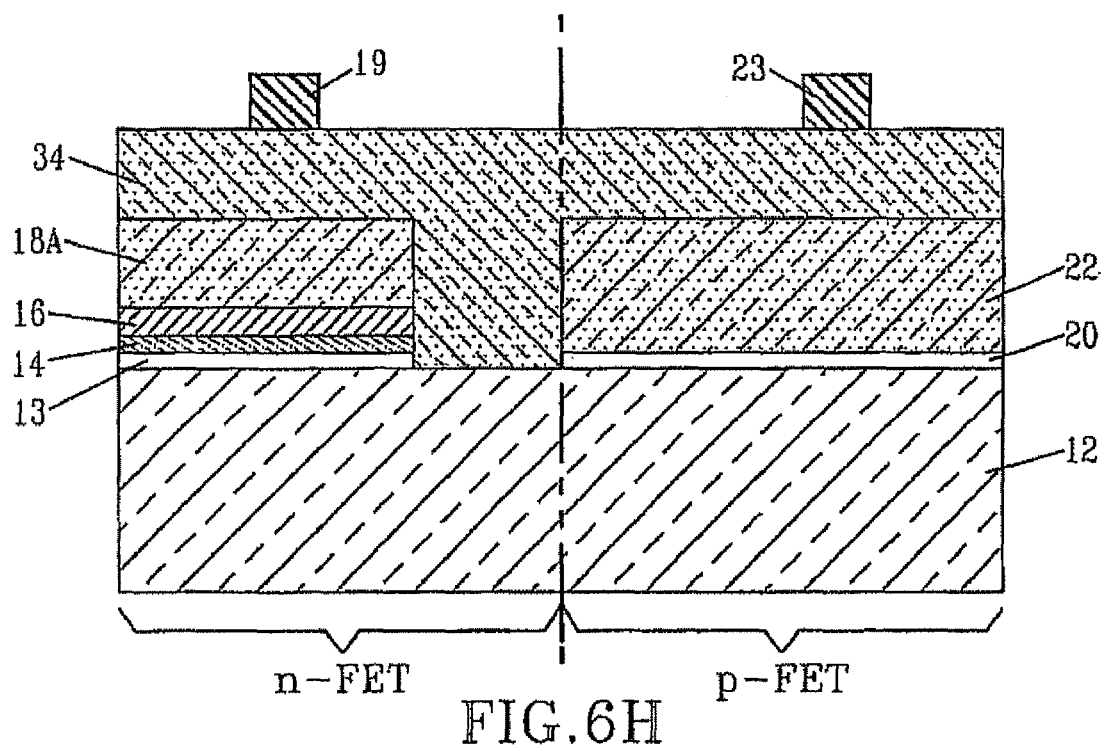

The blanket silicon-containing material layer 34, the silicon-containing gate conductor layer 18A, the metallic gate conductor layer 16, the high k gate dielectric layer 14, the interfacial layer 13, the silicon-containing gate conductor 22, the gate dielectric layer 20, and the dielectric hard mask 36 are then patterned by lithography and etching so as to provide two or more patterned gate stacks, one for the n-FET and one for the p-FET as shown in FIG. 5. The lithography steps include applying a photoresist (not shown) to the upper surface of the dielectric hard mask layer 36, exposing the photoresist to a desired pattern of radiation and developing the exposed photoresist utilizing a conventional resist developer. The pattern in the photoresist is then transferred to the dielectric mask layer 36, forming patterned dielectric hard masks 19 and 23, as shown in FIG. 6H. The patterned photoresist is then removed, and the pattern in the hard masks 19 and 23 is subsequently transferred to the underlying layers, utilizing one or more dry and/or wet etching steps, to form the patterned n-FET and p-FET gate stacks as shown in FIG. 5. Suitable dry etching processes that can be used in the present invention in forming the patterned gate stacks include, but are not limited to: reactive ion etching (RIE), ion beam etching, plasma etching or laser ablation. The hard masks 19 and 23 are removed from the patterned gate stacks after the patterning.

Figure 7:
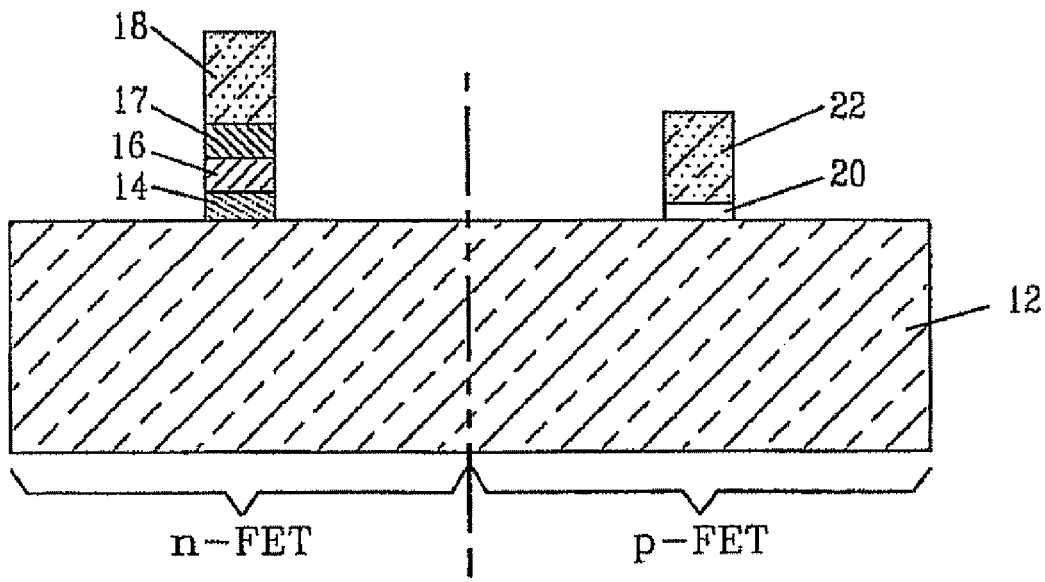
FIG. 7 is a cross-sectional view of a patterned n-FET gate stack and a patterned p-FET gate stack located next to each other, according to one embodiment of the present invention. Specifically, the patterned n-FET gate stack comprises, from bottom to top, a high k gate dielectric, a metal gate conductor, an oxygen diffusion banter layer, and a polysilicon gate conductor. The patterned p-FET gate stack comprises, from bottom to top, a semiconductor oxide or semiconductor oxynitride gate dielectric and a polysilicon gate conductor.

FIG. 7 is a cross-sectional view of a patterned n-FET gate stack and a patterned p-FET gate stack located next to each other, according to one embodiment of the present invention. Specifically, the patterned n-FET gate stack comprises, from bottom to top, a high k gate dielectric 14, a metal gate conductor 16, a conductive oxygen diffusion barrier layer 17, and a polysilicon gate conductor 18. The patterned p-FET gate stack comprises, from bottom to top, a semiconductor oxide or semiconductor oxynitride gate dielectric 20 and a polysilicon gate conductor 22.

The conductive oxygen diffusion banner layer 17 functions to protect the n-FET gate stack from the harsh thermal oxidation processing conditions that are used to form the gate dielectric 20 in the p-FET device region. Such conductive oxygen diffusion barrier layer 17 preferably comprises an amorphous oxygen banner material, such as TaSiN or HfSiN, which can prevent the diffusion of oxygen and effectively protect the n-FET gate stack from thermal oxidation conditions.

FIGS. 8A-8G show exemplary processing steps for forming the patterned n-FET and p-FET gate stacks of FIG. 7.

Figure 8A:
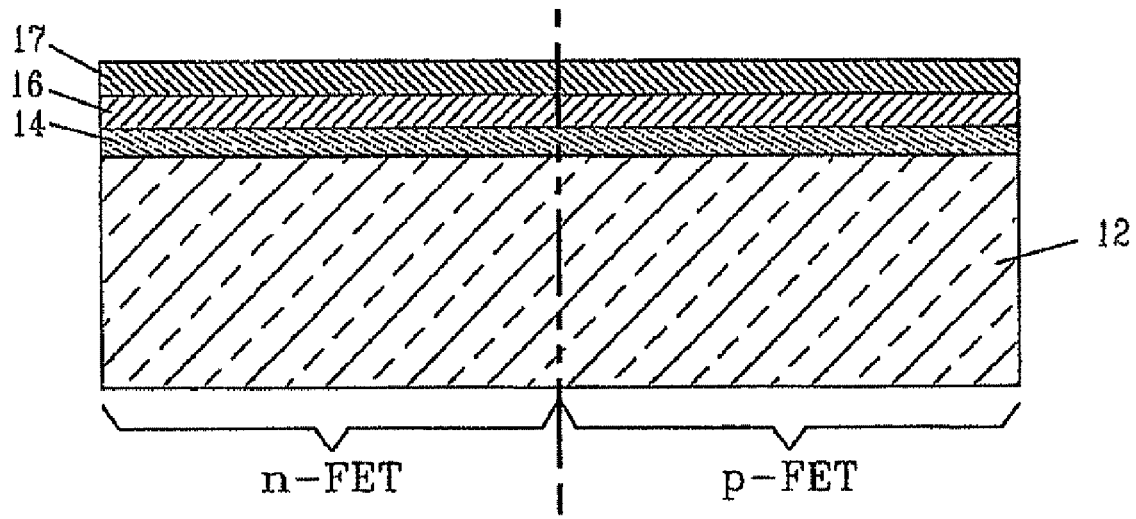
FIGS. 8A-8G show cross-sectional views that illustrate exemplary processing steps for forming the patterned n-PET and p-FET gate stacks of FIG. 7.
Figure 8B:
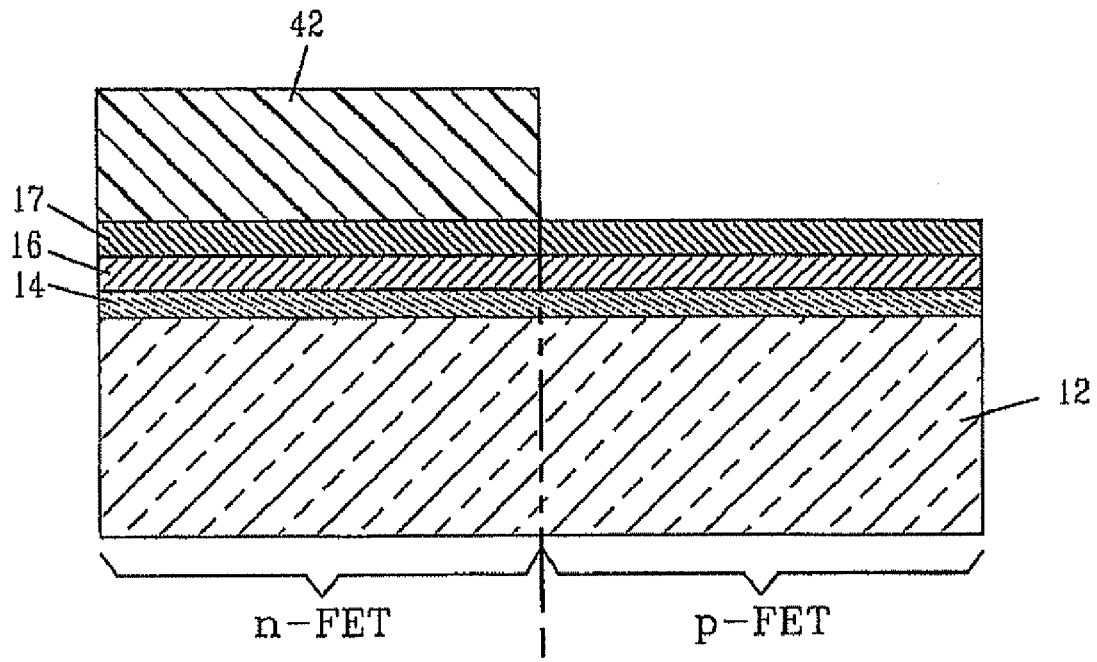
Figure 8C:
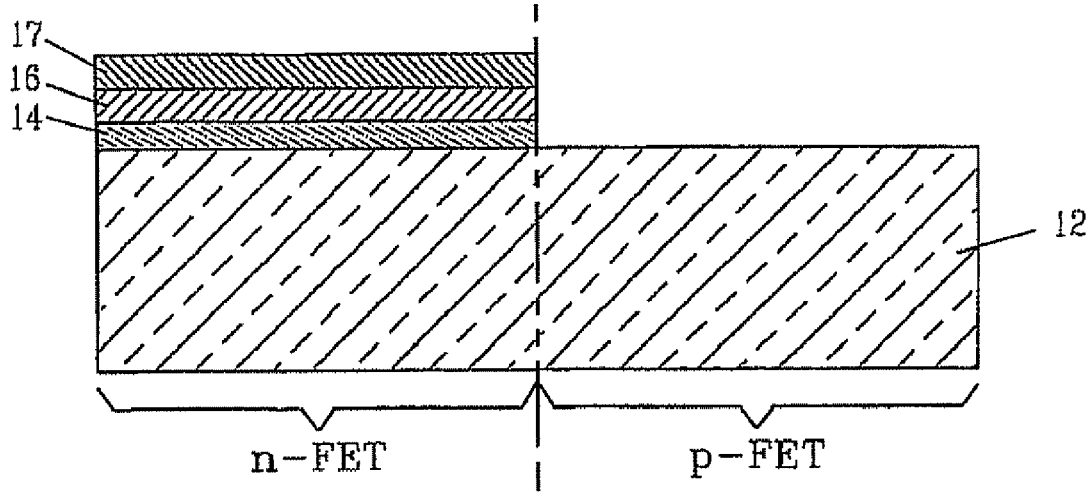
Figure 8D:
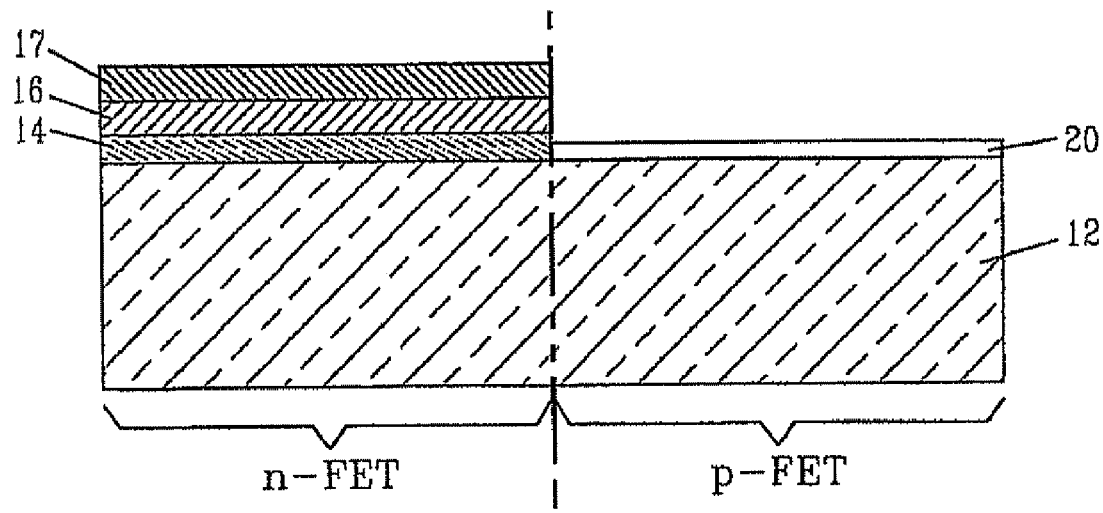

Specifically, FIG. 8A shows formation of a blanket high k gate dielectric layer 14, a blanket metallic gate conductor layer 16, and a blanket conductive oxygen diffusion barrier layer 17 over both the n-FET and the p-FET device regions. Next, a photoresist material 42 is formed over the conductive oxygen diffusion barrier layer 17 to selectively cover the n-FET device region, as shown in FIG. 5B. Selective etching is then carried out to remove portions of the high k gate dielectric layer 14, the metallic gate conductor layer 16, and the conductive oxygen diffusion barrier layer 17 from the p-FET device region, thereby exposing an upper surface of the semiconductor substrate 12 in the p-FET device region, as shown in FIG. 8C.

Thermal oxidation is then carried out to form the gate dielectric layer 20 in the p-FET device region, while the n-FET device region is protected from the thermal oxidation by the conductive oxygen diffusion barrier layer 17. Preferably, the thermal oxidation process includes a rapid thermal oxidation (RTO) step or a rapid thermal nitrification ($RTNH_3$)/re-oxidation step.

Figure 8E:
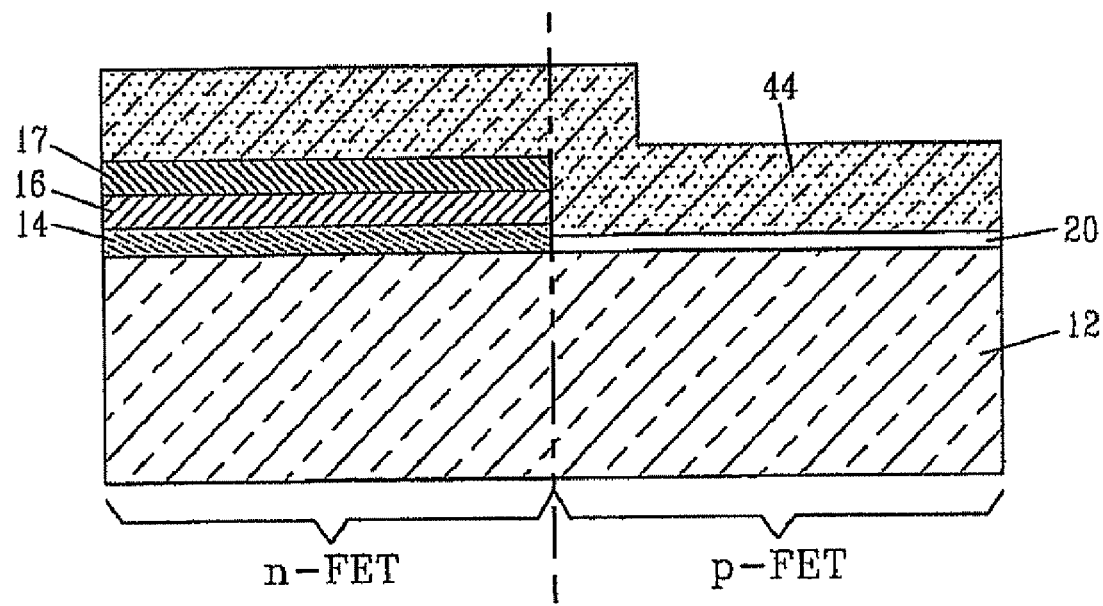
Figure 8F:
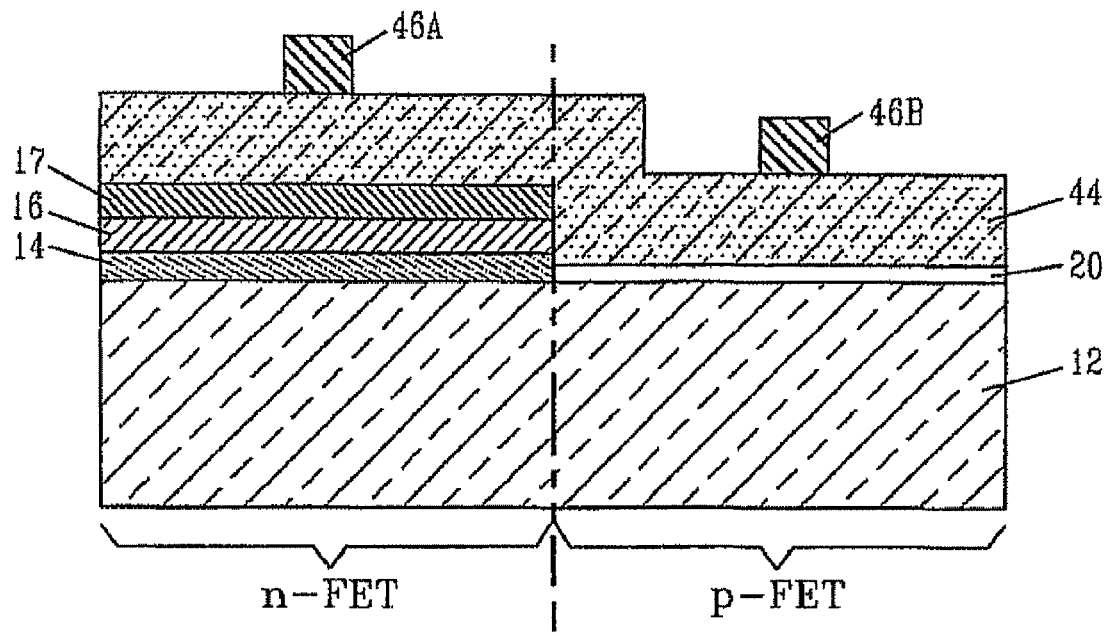
Figure 8G:
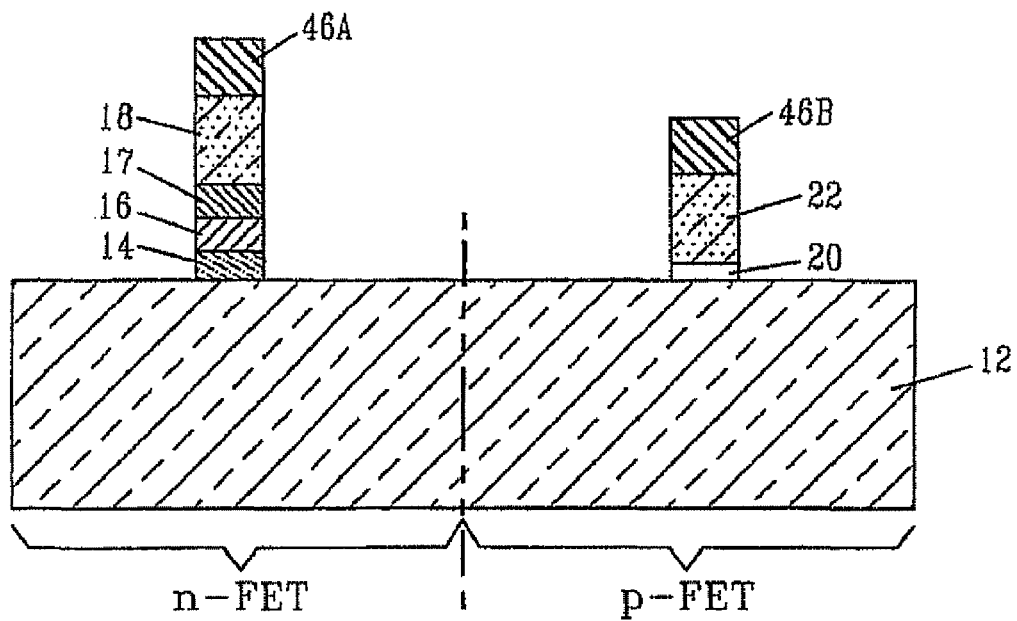

Subsequently, a blanket silicon-containing material layer 44 is deposited over both the n-FET and the p-FET device regions, as shown by FIG. 8E. The blanket silicon-containing material layer 44, the conductive oxygen diffusion barrier layer 17, the metallic gate conductor layer 16, the high k gate dielectric layer 14, and the gate dielectric 20 are then patterned by lithography and etching, so as to provide two or more patterned gate stacks, one for the n-FET and one for the p-FET. Specifically, patterned polyconductor (PC) resists 46A and 46B, as shown in FIG. 8F, are respectively formed over the n-FET and p-FET device regions by gate level lithography, and the pattern in the PC resists 46A and 46B is transferred to the continuous silicon-containing material layer 44, the metallic gate conductor layer 16, the high k gate dielectric layer 14, and the gate dielectric 20, utilizing one or more dry and/or wet etching steps, forming the patterned n-FET and p-FET gate stacks as shown in FIG. 8G. Suitable dry etching processes that can be used in the present invention in forming the patterned gate stacks include, but are not limited to: reactive ion etching (RIE), ion beam etching, plasma etching or laser ablation. Suitable wet etching processes employ one or more etching solutions that can react with specific structural layers for removal of such layers.

The patterned PC resists 46A and 46B are then removed after etching has been completed, resulting in the patterned n-FET and p-FET gate stacks as shown in FIG. 7.

Although FIGS. 8A-8G illustrate formation of patterned n-FET and p-FET gate stacks using a conductive oxygen diffusion barrier layer 17, which is subsequent retained in and becomes a part of the final n-FET gate structure, it is important to note that an insulating oxygen diffusion barrier layer (not shown), which contains an insulating material capable of preventing oxygen diffusion, can also be used to protect the n-FET gate stack during the thermal oxidation process as described hereinabove. Such an insulating oxygen diffusion barrier layer is removed after the thermal oxidation process. Therefore, the final n-FET gate structure formed by this alternative process does not contain any oxygen diffusion barrier layer and has substantially the same structure as the n-FET gate stack shown by FIG. 1.

Figure 9:
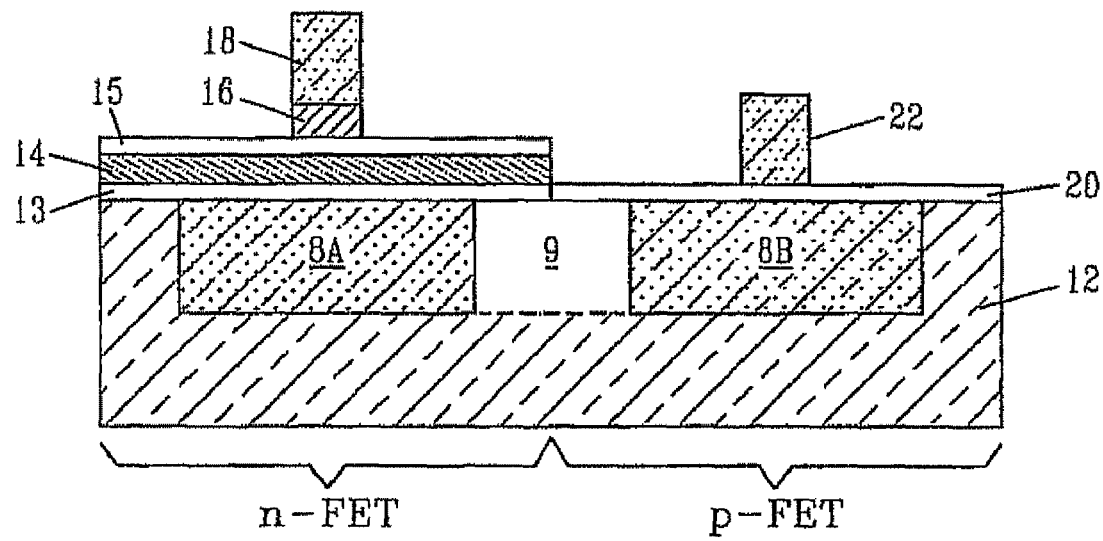
FIG. 9 is a cross-sectional view of an n-FET gate structure and a p-FET gate structure located next to each other, according to one embodiment of the present invention. Specifically, the n-PET gate structure comprises, from bottom to top, an un-patterned interfacial layer, an un-patterned $HfO_2$ layer, an un-patterned RE-containing or AE-containing layer, a metal gate conductor, and a polysilicon gate conductor. The p-FET gate structure comprises, from bottom to top, an un-patterned semiconductor oxide or semiconductor oxynitride gate dielectric and a polysilicon gate conductor.

FIG. 9 shows an n-FET gate structure and a p-FET gate structure located next to each other, according to one embodiment of the present invention. Specifically, the n-FET gate structure is located over an n-FET device region defined by a p-well 8A, and the p-FET gate structure is located over a p-FET device region defined by an n-well 8B, which are isolated from each other by the STI region 9. The n-FET gate structure comprises, from bottom to top, an un-patterned interfacial layer 13, an un-patterned HfO$_2$ gate dielectric layer 14, an un-patterned RE-containing or AE-containing layer 15, a metal gate conductor 16, and a polysilicon gate conductor 18. The p-FET gate structure comprises, from bottom to top, an un-patterned semiconductor oxide or semiconductor oxynitride gate dielectric layer 20 and a polysilicon gate conductor 22.

In one embodiment of the present invention, layer 15 is a RE-containing (i.e., rare earth metal-containing) layer, which comprises an oxide or nitride of at least one element selected from Group IIIB of the Periodic Table of Elements, such as, for example, La, Ce, Pr, Nd, Pm, Sm, Eu, Ga, Tb, Dy, Ho, Er, Fm, Yb, Lu, or mixtures thereof. Preferably, the RE-containing layer 16 comprises an oxide of La, Ce, Y, Sm, Er, and/or Tb, with LaO$_3$ or LaN being most preferred. The RE-containing layer 16 is formed utilizing a conventional deposition process including, for example, evaporation, molecular beam deposition, MOCVD, ALD, PVD, and other suitable processes. The RE-containing layer 15 typically has a thickness from about 0.1 nm to about 3.0 nm, with a thickness from about 0.3 nm to about 1.6 nm being more typical.

As a specific example, the RE-containing layer 15 is formed by placing the entire device structure into the load-lock of a molecular beam deposition chamber, followed by pumping this chamber down to the range of $10^{-5}$ to $10^{-8}$ Torr. After these steps, the device structure is inserted, without breaking vacuum into the growth chamber where the RE-containing layer 15 such as La oxide is deposited by directing atomic/molecular beams of the rare earth metal and oxygen or nitrogen onto the structure's surface. Specifically, because of the low pressure of the chamber, the released atomic/molecular species are beamlike and are not scattered prior to arriving at the structure. A substrate temperature of about 300° C. is used. In the case of La$_2$O$_3$ deposition, the La evaporation cell is held in the temperature range of 1400° to 1700° C., and a flow rate of 1 to 3 sccm of molecular oxygen is used. Alternatively, atomic or excited oxygen may be used as well, and this can be created by passing the oxygen through a radio frequency source excited in the range of 50 to 600 Watts. During the deposition, the pressure within the chamber can be in the range from $1 \times 10^{-5}$ to $8 \times 10^{-5}$ Torr, and the La oxide growth rate can be in the range from 0.1 to 2 nm per minute, with a range from 0.5 to 1.5 nm being more typical.

In an alternative embodiment of the present invention, layer 15 is an AE-containing (i.e., alkaline earth metal-containing) layer which comprises a compound having the formula $M_xA_y$, wherein M is an alkaline earth metal (e.g., Be, Mg, Ca, Sr, and/or Ba), A is one of O, S or a halide, x is 1 or 2, and y is 1, 2, or 3. It is noted that the present invention contemplates AE-containing compounds that include a mixture of alkaline earth metals and/or a mixture of anions, such as —OCl$^{-2}$. Examples of AE-containing compounds that can be used in the present invention include, but are not limited to: MgO, MgS, MgF$_2$, MgCl$_2$, MgBr$_2$, MgI$_2$, CaO, CaS, CaF$_2$, CaCl$_2$, CaBr$_2$, CaI$_2$, SrO, SrS, SrF$_2$, SrCl$_2$, SrBr$_2$, SrI$_2$, BaO, BaS, BaF$_2$, BaCl$_2$, BaBr$_2$, and BaI$_2$. In one preferred embodiment of the present invention, the AE-containing compound includes Mg. MgO is a highly preferred AE-containing material employed in the present invention. The AE-containing layer 15 is formed utilizing a conventional deposition process including, for example, sputtering from a target, reactive sputtering of an alkaline earth metal under oxygen plasma conditions, electroplating, evaporation, molecular beam deposition, MOCVD, ALD, PVD and other like deposition processes. The AE-containing material 15 typically has a deposited thickness from about 0.1 nm to about 3.0 nm, with a thickness from about 0.3 nm to about 1.6 mm being more typical.

Figure 10A:
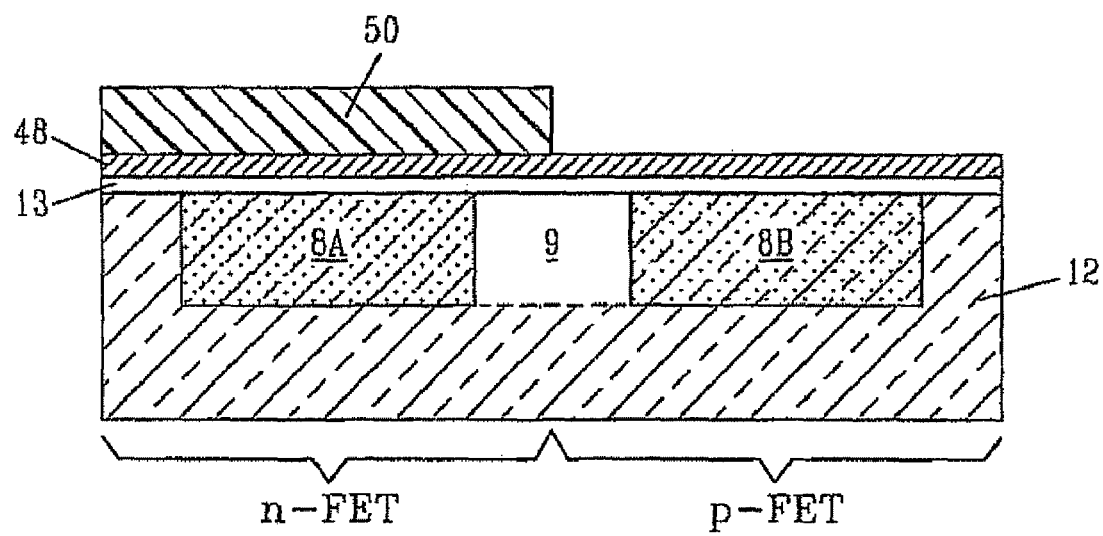
FIGS. 10A-10J show cross-sectional views that illustrate exemplary processing steps for forming the n-FET and p-FET gate structures of FIG. 9 and for further forming an n-FET and a p-FET using the respective gate structures.
Figure 10B:
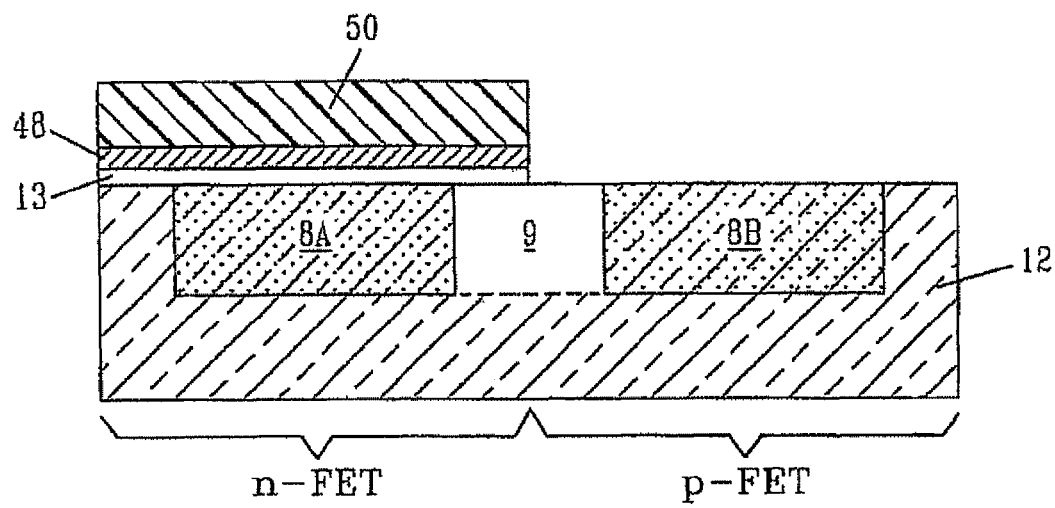
Figure 10C:
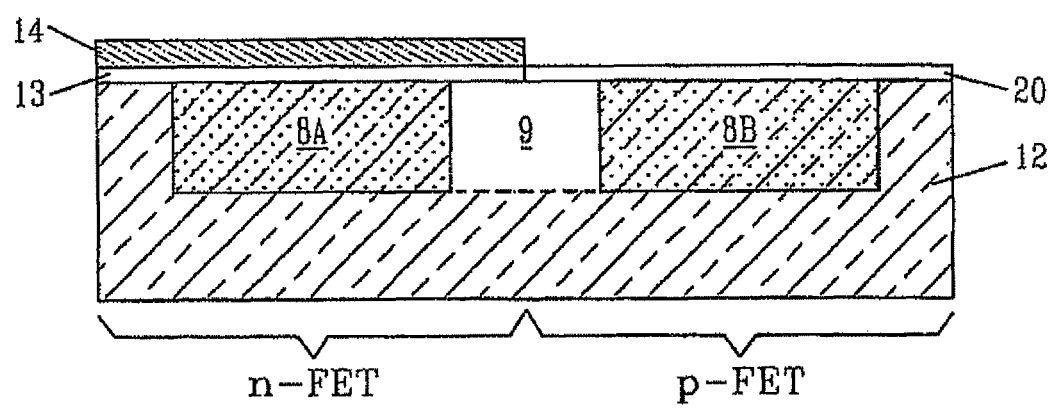
Figure 10D:
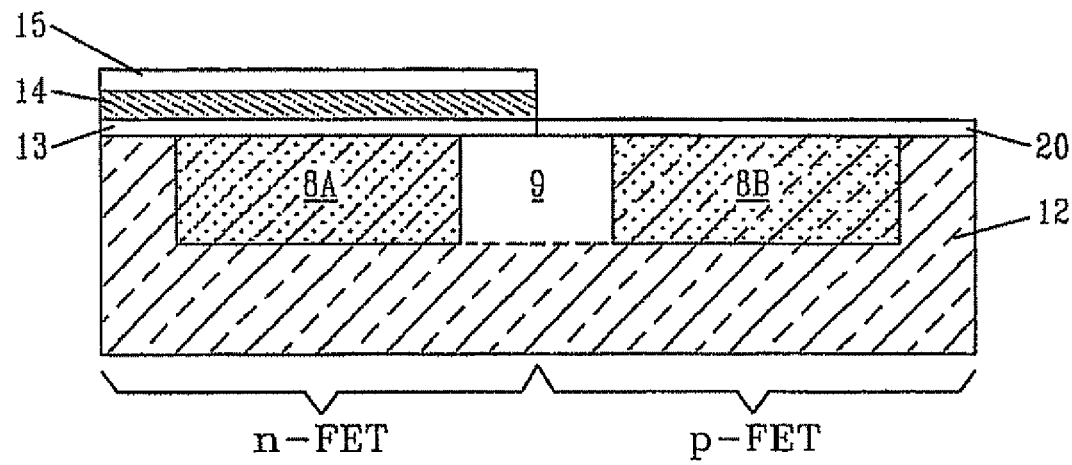
Figure 10E:
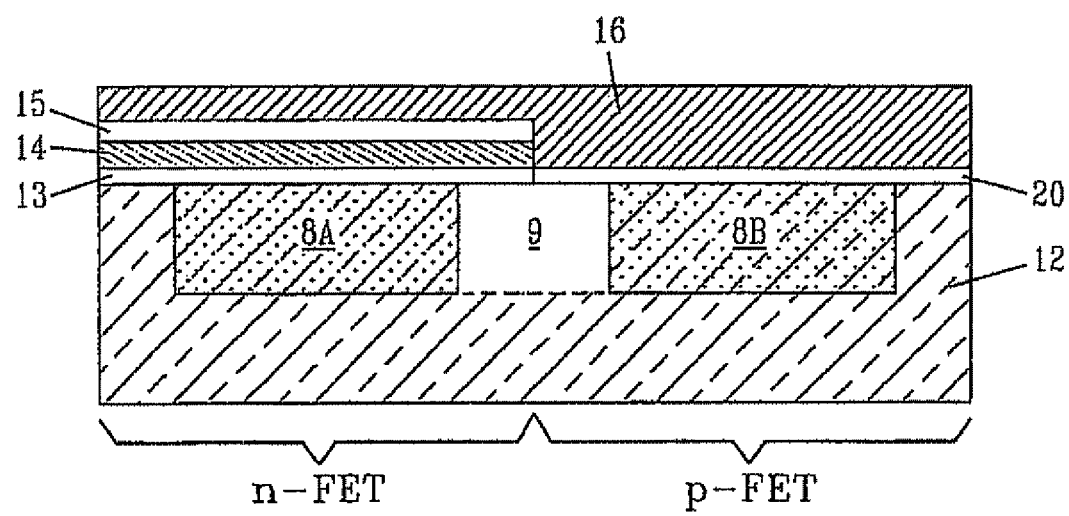
Figure 10F:
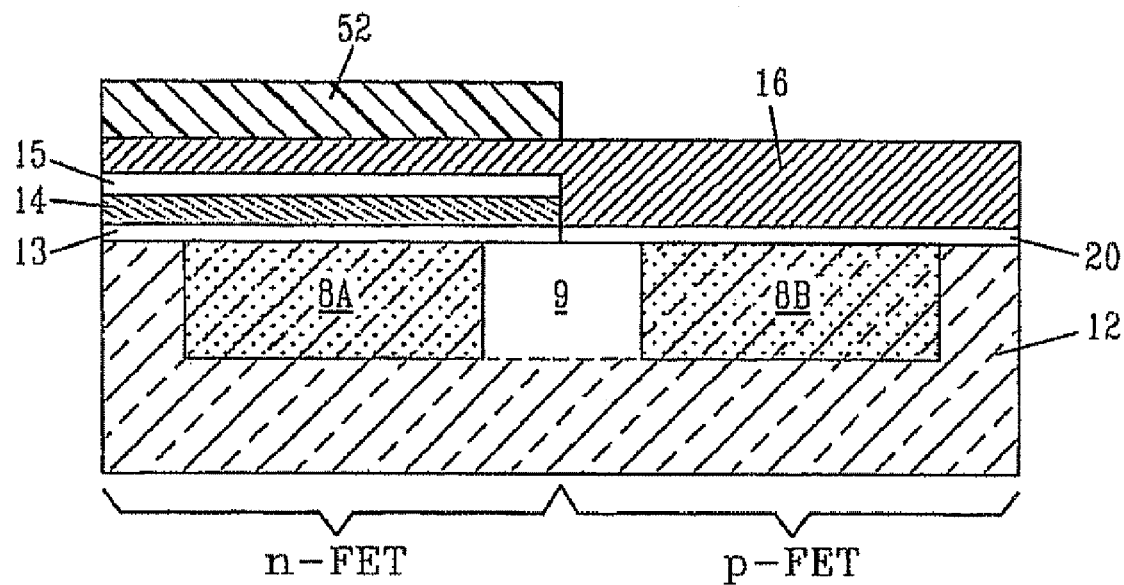
Figure 10G:
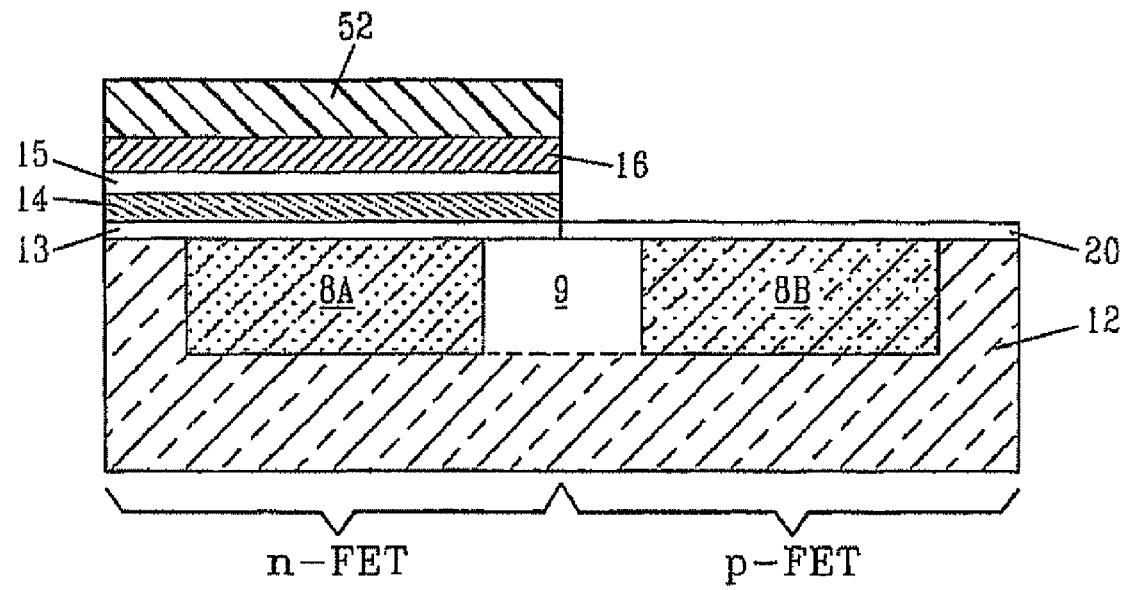
Figure 10H:
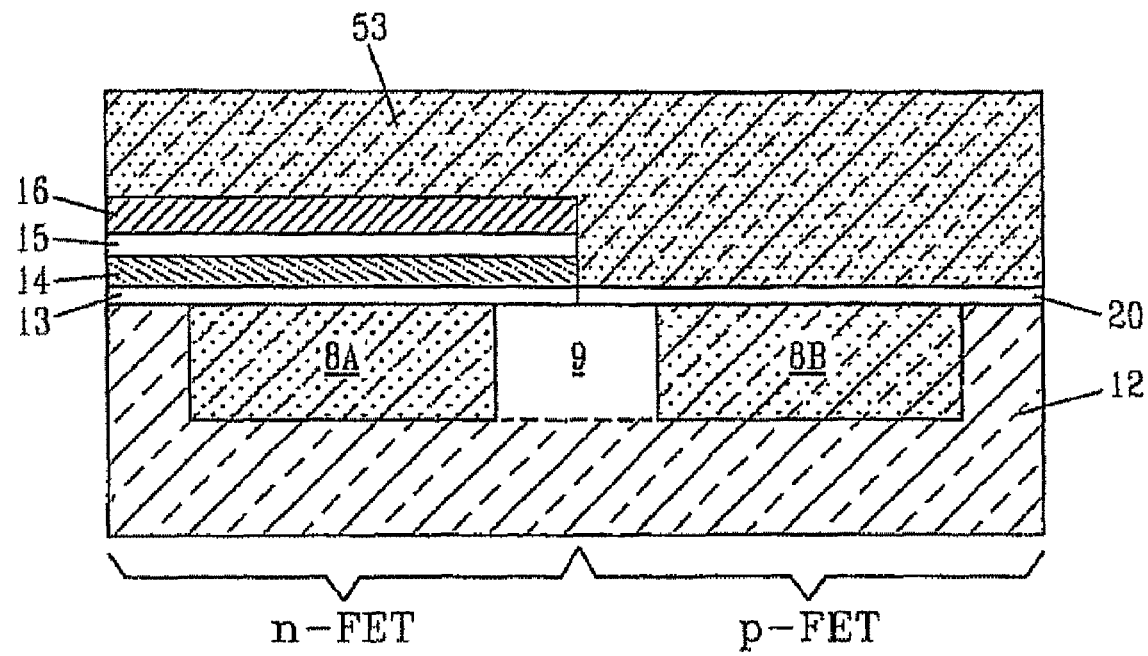
Figure 10I:
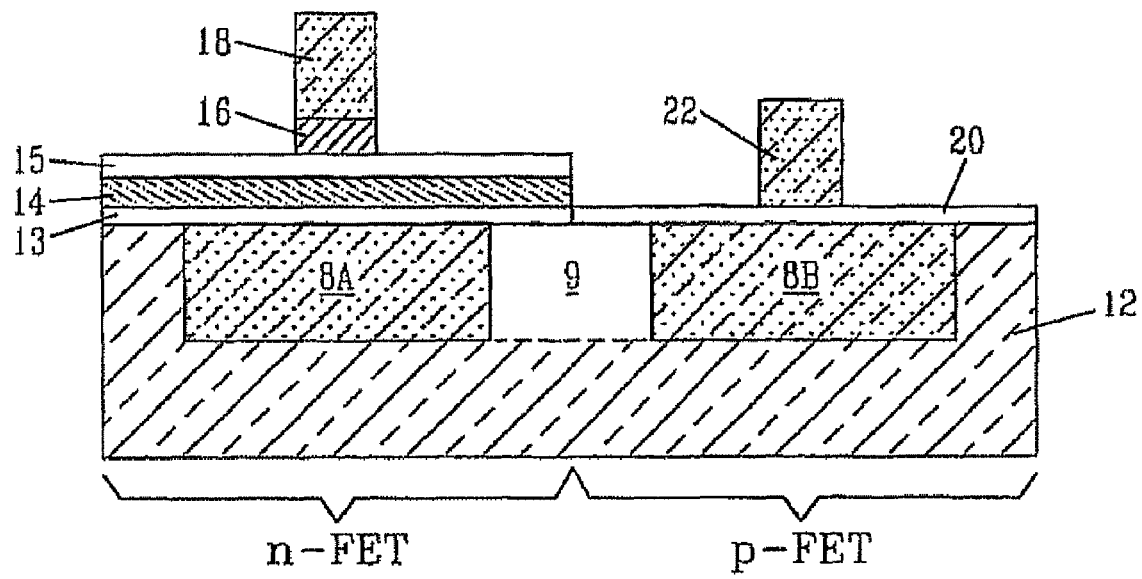
Figure 10J:
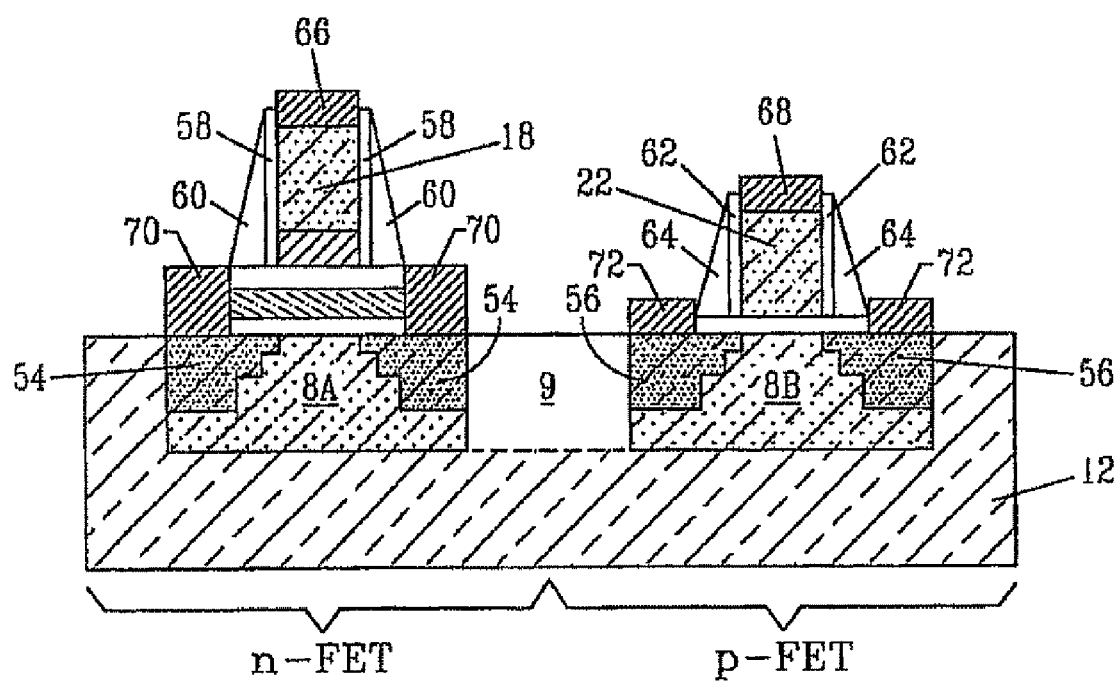

FIGS. 10A-10I show cross-sectional views that illustrate exemplary processing steps for forming the n-FET and p-FET gate structures of FIG. 9, and FIG. 10J further illustrates formation of complete n-FET and p-FET devices using the respective gate structures shown in FIG. 10I.

Specifically, FIG. 10A shows formation of an interfacial layer 13 and a hafnium layer 48 over both the n-FET and die p-FET device regions. A dielectric hard mask 50 is formed over the n-FET device region to selective over the n-FET device region. One or more selective etching steps are carried out using the hard mask 50 to selectively remove portions of the interfacial layer 13 and the hafnium layer 48 from the p-FET device region, thereby exposing an upper surface of the semiconductor substrate 12 in the p-FET device region, as shown in FIG. 10R. The hard mask 50 is then removed, followed by a rapid thermal oxidation/nitrification step, which forms an HfO$_2$ gate dielectric layer 14 over the n-FET device region and a semiconductor oxide or semiconductor oxynitride gate dielectric layer 20 over the p-FET device region, as shown in FIG. 10C.

Subsequently, a RE-containing or an AE-containing layer 15 is selectively deposited over the n-FET device region, as shown in FIG. 10D. A blanket metallic gate conductor layer 16 is then formed over both the n-FET and the p-FET device regions, as shown in FIG. 10E.

Subsequently, a patterned hard mask 52 is deposited over the n-FET device region to allow selective etching of the blanket metallic gate conductor layer 16 from the p-FET device region, as shown in FIGS. 10F and 10G. The patterned hard mask 52 is removed after the selective etching, and a blanket silicon-containing material layer 53 is deposited over both the n-FET and the p-FET device regions, as shown in FIG. 10H.

The blanket silicon-containing material layer 53 and the metallic gate conductor layer 16 are then patterned by lithography and etching, so as to the n-FET and p-FET gate structures as shown in FIG. 10I. Specifically, patterned polyconductor (PC) resists (not shown) are respectively formed over the n-FET and p-FET device regions by gate level lithography, and the pattern in the PC resists is transferred to the continuous silicon-containing material layer 44 and the metallic gate conductor layer 16, utilizing one or more dry etching steps, forming the n-FET and p-FET gate structures of FIG. 10I. Suitable dry etching processes that can be used in the present invention in forming the patterned gate stacks include, but are not limited to: reactive ion etching (RIE), ion beam etching, plasma etching or laser ablation.

Conventional complementary metal-oxide-semiconductor (CMOS) processing steps can then be carried out to form complete n-FET and p-FET devices by using the n-FET and p-FET gate structures shown in FIG. 10I. Such conventional CMOS processing steps may include both front-end-of-line (FEOL) and back-end-of-line (BEOL) steps that are typically used for forming source/drain implants, extension and halo implants, metal silicide contacts, and sidewall spacers. The complete n-FET preferably comprises source and drain implants 54, source/drain metal silicide contacts 70, gate metal silicide contact 66, and sidewall spacers 58 and 60, as shown in FIG. 10J. The complete p-FET preferably comprises source and drain implants 56, source/drain metal suicide contacts 72, gate metal silicide contact 68, and sidewall spacers 62 and 64, as shown in FIG. 10J.

While FIGS. 1-10J illustratively demonstrates several exemplary semiconductor device structures and exemplary processing steps that can be used to form such device structures, according to specific embodiments of the present invention, it is clear that a person ordinarily skilled in the art can readily modify such device structures as well as the processing steps for adaptation to specific application requirements, consistent with the above descriptions. For example, while the CMOS circuits as illustrated hereinabove comprise n-FET gate stacks with metallic gate conductors and high k gate dielectrics and p-FET gate stacks with conventional polysilicon gate conductors and semiconductor oxide or semiconductor oxynitride gate dielectrics, it is clear that a person ordinarily skilled in the art can readily modify such CMOS circuits to provide p-FET gate stacks with metallic gate conductors and high k gate dielectrics and n-FET gate stacks with conventional polysilicon gate conductors and semiconductor oxide or semiconductor oxynitride gate dielectrics, if desired. It should therefore be recognized that the present invention is not limited to the specific embodiments illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. A method for forming a semiconductor device comprising:
providing a semiconductor substrate containing at least first device region and a second device region adjacent to each other;
forming a first gate stack located over the first device region, wherein said first gate stack comprises at least, from bottom to top, a first gate dielectric layer and a first silicon-containing gate conductor located on a surface of said first gate dielectric layer; and
forming a second gate stack located over the second device region, wherein said second gate stack comprises a second gate dielectric layer comprising a dielectric material having a dielectric constant (k) equal to or greater than that of silicon dioxide on the semiconductor substrate, a metal containing layer present on the second gate dielectric, the metal containing layer selected from the group consisting of a rare earth metal-containing layer, an alkaline earth metal-containing layer an a combination of a rare earth metal-containing layer, a metallic gate conductor present on the metal containing layer, and a second silicon-containing gate conductor present on the metallic gate conductor.

2. The method of claim 1 comprising:
forming the first gate dielectric layer and a first silicon containing layer for at least a lower portion of the first silicon-containing gate conductor selectively over the first device region of the semiconductor substrate;
forming a protective capping layer selectively over the first device region;
forming the second gate dielectric layer and the metallic gate conductor selectively over the second device region of the semiconductor substrate;
removing the protective capping layer from the first device region;
depositing a second silicon containing layer over both the first device region and the second device region, wherein the second silicon containing layer provides the second silicon-containing gate conductor; and
patterning the first silicon-containing layer, the metallic gate conductor, the second gate dielectric layer, the second silicon-containing gate conductor, and the first gate dielectric layer to form the first and second gate stacks.

3. The method of claim 1 comprising:
forming the second dielectric layer, the metallic gate conductor and a second silicon-containing layer that provides the second silicon-containing gate conductor selectively over the second device region of the semiconductor substrate;
forming the first gate dielectric layer over both the first device region and the second device region;
depositing a first silicon-containing layer over both the first device region and the second device region, wherein a portion of the first silicon-containing layer provides at least the first silicon-containing gate conductor;
planarizing the first silicon-containing layer, the second gate dielectric layer and the second silicon-containing layer, so as to remove portions of the second silicon-containing layer and the second gate dielectric layer from the first device region and to expose an upper surface of the first silicon-containing layer in the first device region, and wherein the exposed first silicon-containing layer that provides the first silicon-containing gate conductor in the first device region is substantially coplanar with the un-removed portion of the second silicon-containing layer in the second device region; and
patterning the exposed first silicon-containing layer that provides the first silicon-containing gate conductor, the metallic gate conductor, the first gate dielectric layer and the un-removed portions of the second silicon-containing layer and the second gate dielectric layer to form the first and second gate stacks.

4. The method of claim 1 comprising:
forming the second dielectric layer, the metallic gate conductor and a second silicon-containing layer that provides the second silicon-containing gate conductor selectively over the second device region of the semiconductor substrate;
forming the first gate dielectric layer over both the first device region and the second device region;
depositing a first silicon-containing layer over both the first device region and the second device region;
selectively etching the first silicon-containing layer to remove a portion of the first silicon-containing layer from the second device region;
selectively etching the first gate dielectric layer to remove a portion of the first gate dielectric layer from the second device region, thereby exposing an upper surface of the second silicon-containing layer that provides the second silicon-containing gate conductor; and
patterning the exposed second silicon-containing layer that provides the second silicon-containing gate conductor, the metallic gate conductor, the first gate dielectric layer and un-removed portions of the first silicon-containing layer and the first gate dielectric layer to form the first and second gate stacks.

5. The method of claim 1 comprising:
forming the first gate dielectric layer and a first silicon-containing layer for the first silicon-containing gate conductor selectively over the first device region of the semiconductor substrate;
forming an interfacial layer, the second gate dielectric layer, the metallic layer, and a second silicon-containing layer that provides the second silicon-containing gate conductor over both the first device region and the second device region;
selectively removing the interfacial layer, a portion of the second gate dielectric layer, a portion of the metallic layer, and a portion of the second silicon-containing layer from the first device region, thereby exposing an upper surface of the first silicon-containing gate conductor in the first device region;
forming an additional silicon-containing layer over both the first device region and the second device region; and
patterning the additional silicon-containing layer, the first silicon-containing layer, the metallic layer, the second dielectric layer, the interfacial layer, the second silicon-containing gate conductor and the first gate dielectric layer to form the first and second gate stacks.

6. The method of claim 1, wherein the first device region is a p-type semiconductor device region and the second device region is an n-type semiconductor device region.

7. The method of claim 1, wherein the metallic gate conductor of the second gate stack comprises a metal nitride or a metal silicon nitride that contains a Group IVB or VB metal.

8. The method of claim 7, wherein the metallic gate conductor of the second gate stack comprises TiN, TaN, a ternary alloy of Ti-alkaline earth metal-N, a ternary alloy of Ta-alkaline earth metal-N, a ternary alloy of Ti-rare earth metal-N, a ternary alloy of Ta-rare earth metal-N, or a stack comprising a mixture thereof.

9. The method of claim 1, wherein the first silicon-containing gate conductor of the first gate stack and the second silicon-containing gate conductor of the second gate stack both comprise polycrystalline silicon.

10. The method of claim 1, further comprising forming a conductive oxygen barrier layer located above the metallic gate conductor and beneath second silicon-containing gate conductor.

11. The method of claim 10 comprising:
forming the second dielectric layer, the metallic gate conductor and the conductive oxygen diffusion barrier layer selectively over the second device region of the semiconductor substrate;
oxidizing an exposed upper surface of the semiconductor substrate in the first device region to form the first gate dielectric layer, wherein the conductive oxygen diffusion barrier layer protects the second device region from oxidation;
depositing a silicon-containing layer over both the first device region and the second device region; and
patterning the silicon-containing layer, the conductive oxygen diffusion barrier layer, the metallic gate conductor, the first gate dielectric layer, and the second gate dielectric layer to form the first and second gate stacks.

12. The method of claim 10, wherein the conductive oxygen barrier layer comprises tantalum silicon nitride or hafnium silicon nitride.

13. The method of claim 1 wherein the semiconductor substrate comprises Si, Ge, SiGe, SiC, SiGeC, Ga, GaAs, InAs, InP, III/V compound semiconductors, II/VI compound semiconductors or a combination thereof.

14. The method of claim 1, wherein one of the first gate dielectric layer and the second gate dielectric layer is a hafnium based high-k gate dielectric layer that is selected from the group consisting of hafnium oxide ($HfO_2$), hafnium silicate ($HfSiO_x$), hafnium silicon oxynitride (HfSiON), a mixture of hafnium oxide and zirconium oxide ($ZrO_2$) and multilayers thereof.

15. The method of claim 1, wherein one of the first gate dielectric layer and the second gate dielectric layer is selected from the group consisting of semiconductor oxide, semiconductor oxynitride, $Al_2O_3$, AlON, AlN, and combinations thereof.

* * * * *